(12) United States Patent
Kim

(10) Patent No.: US 12,068,270 B2
(45) Date of Patent: Aug. 20, 2024

(54) SEMICONDUCTOR PACKAGE

(71) Applicant: Samsung Electronics Co., Ltd., Suwon-si (KR)

(72) Inventor: Jongyoun Kim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 198 days.

(21) Appl. No.: 17/112,567

(22) Filed: Dec. 4, 2020

(65) Prior Publication Data

US 2021/0375810 A1 Dec. 2, 2021

(30) Foreign Application Priority Data

May 27, 2020 (KR) .................. 10-2020-0063599

(51) Int. Cl.
*H01L 23/538* (2006.01)
*H01L 23/00* (2006.01)
*H01L 23/14* (2006.01)
*H01L 23/498* (2006.01)

(52) U.S. Cl.
CPC .............. *H01L 24/14* (2013.01); *H01L 23/14* (2013.01); *H01L 23/49811* (2013.01); *H01L 23/5384* (2013.01); *H01L 23/5385* (2013.01); *H01L 23/5386* (2013.01)

(58) Field of Classification Search
CPC ..... H01L 23/5386; H01L 24/29; H01L 24/32; H01L 23/49838; H01L 23/525
See application file for complete search history.

(56) References Cited

U.S. PATENT DOCUMENTS

| | | | |
|---|---|---|---|
| 7,977,783 B1 | 7/2011 | Park et al. | |
| 8,174,124 B2 | 5/2012 | Chiu et al. | |
| 8,193,639 B2 | 6/2012 | Liu et al. | |
| 8,786,081 B2 | 7/2014 | Chen | |
| 9,431,367 B2 | 8/2016 | Lin et al. | |
| 9,613,914 B2 | 4/2017 | Chen et al. | |
| 9,793,246 B1 * | 10/2017 | Tseng | H01L 23/3128 |
| 9,972,581 B1 * | 5/2018 | Yu | H01L 21/568 |
| 10,014,260 B2 | 7/2018 | Tsai et al. | |
| 10,163,815 B2 | 12/2018 | Lin et al. | |
| 10,290,600 B2 * | 5/2019 | Wu | H01L 23/53238 |
| 2019/0103372 A1 | 4/2019 | Chen et al. | |

(Continued)

FOREIGN PATENT DOCUMENTS

| | | |
|---|---|---|
| CN | 111293090 A | 6/2020 |
| KR | 1020180155947 A | 6/2020 |
| KR | 1020200068958 A | 6/2020 |

*Primary Examiner* — Michele Fan
(74) *Attorney, Agent, or Firm* — Muir Patent Law, PLLC

(57) ABSTRACT

A semiconductor package includes a redistribution substrate, and a semiconductor chip disposed on a top surface of the redistribution substrate. The redistribution substrate includes under bump patterns laterally spaced apart from each other, a dummy pattern disposed between the under bump patterns, a passivation pattern disposed on a bottom surface of the dummy pattern, an insulating layer covering top surfaces and sidewalls of the under bump patterns and a sidewall and a top surface of the dummy pattern, and a redistribution pattern disposed on one of the under bump patterns and electrically connected to the one under bump pattern. The passivation pattern includes a different material from that of the insulating layer.

19 Claims, 19 Drawing Sheets

(56) References Cited

U.S. PATENT DOCUMENTS

| | | | |
|---|---|---|---|
| 2019/0148262 A1* | 5/2019 | Pei | H01L 21/486 |
| | | | 257/713 |
| 2020/0051936 A1 | 2/2020 | Huang et al. | |
| 2020/0135600 A1* | 4/2020 | Chen | H01L 25/50 |
| 2020/0185314 A1 | 6/2020 | Kim | |
| 2021/0280540 A1* | 9/2021 | Kim | H01L 23/538 |

* cited by examiner

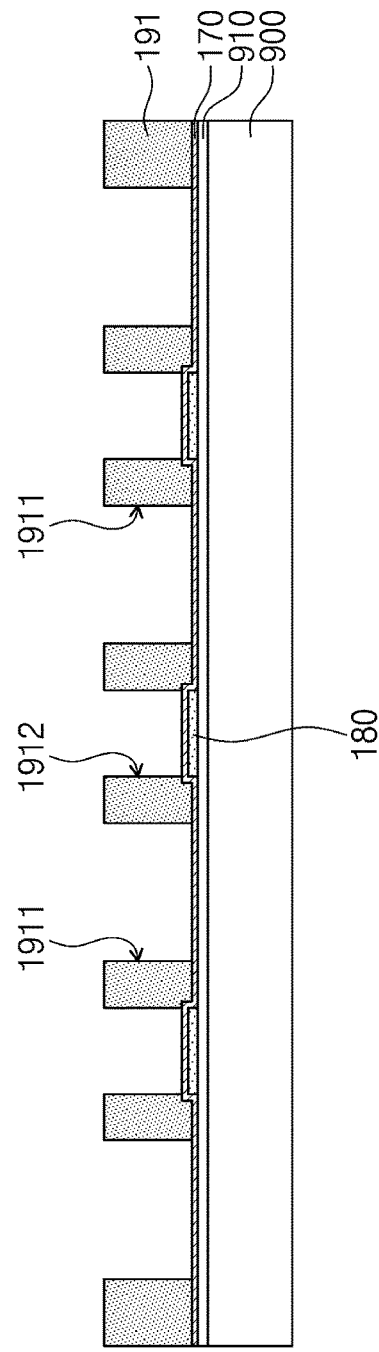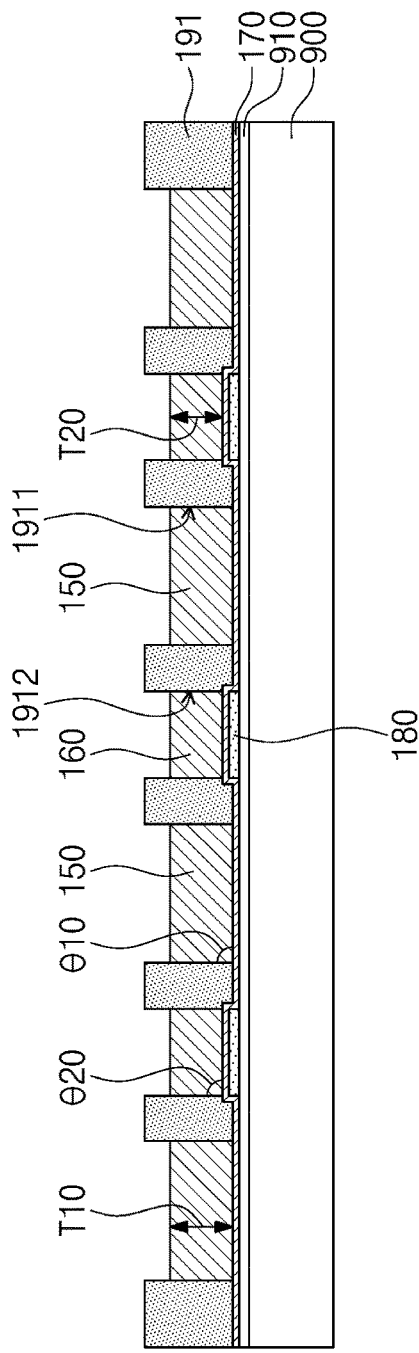

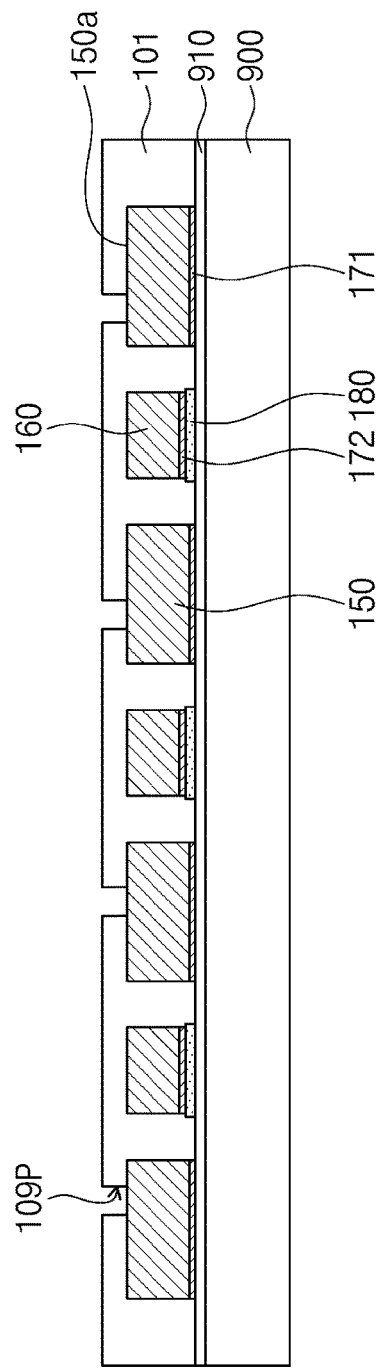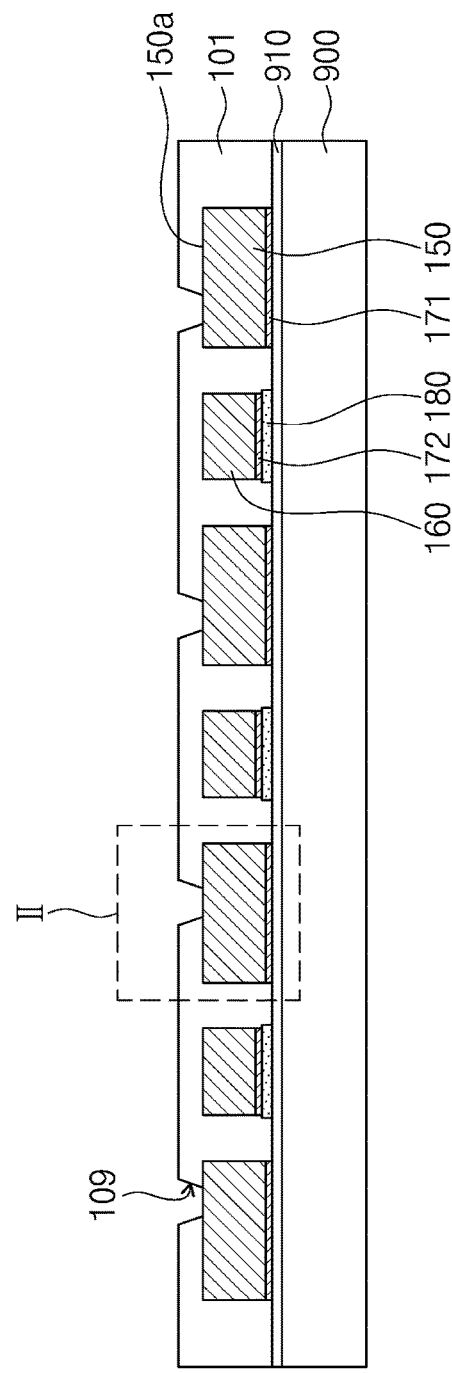

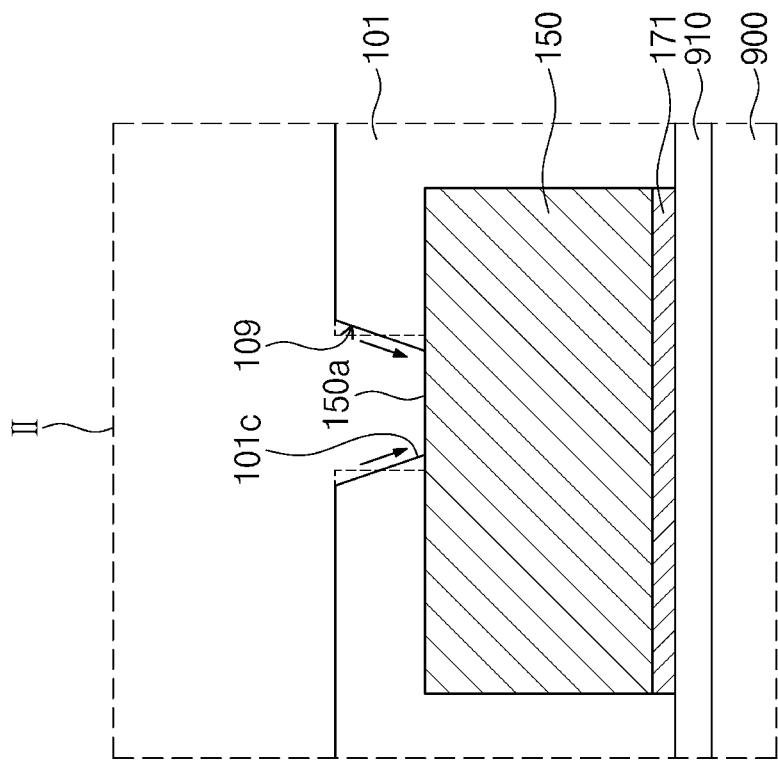

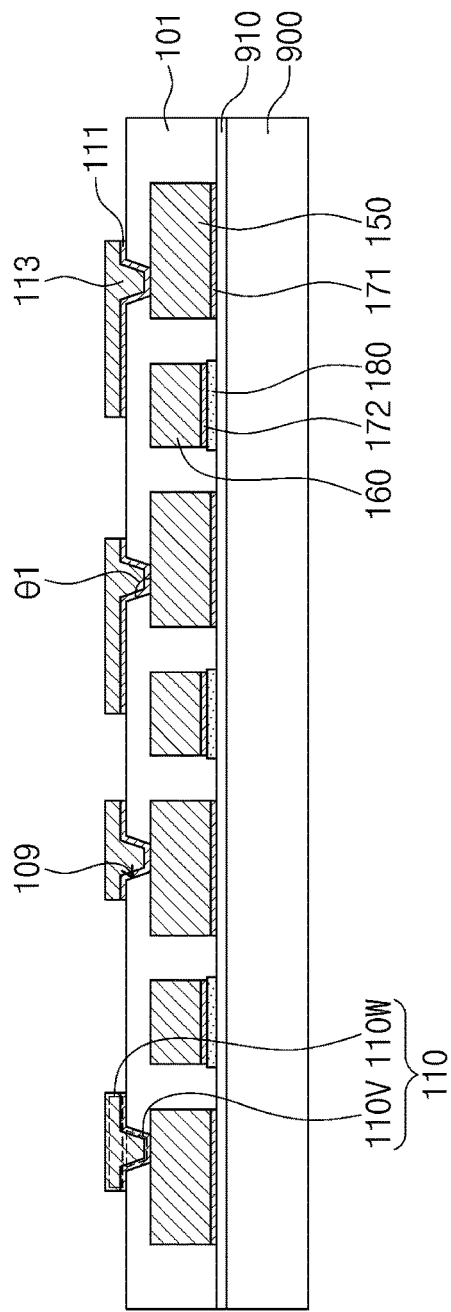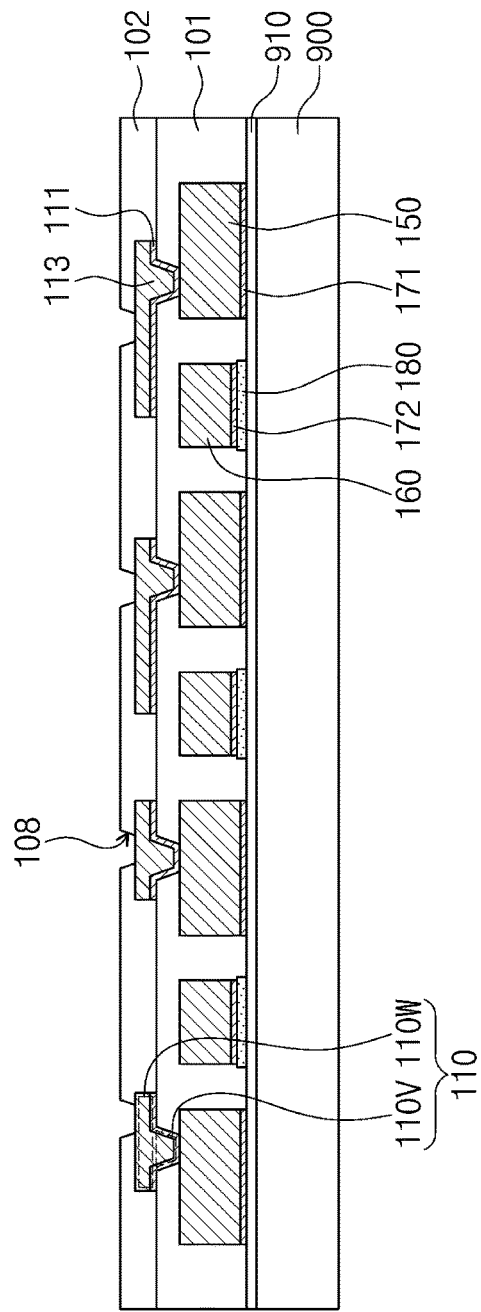

SEMICONDUCTOR PACKAGE

CROSS-REFERENCE TO RELATED APPLICATION

This U.S. non-provisional patent application claims priority under 35 U.S.C. § 119 to Korean Patent Application No. 10-2020-0063599, filed on May 27, 2020, in the Korean Intellectual Property Office, the disclosure of which is hereby incorporated by reference in its entirety.

BACKGROUND

Embodiments of the inventive concepts relate to a semiconductor package and, more particularly, to a semiconductor package including a redistribution substrate and a method of manufacturing the same.

An integrated circuit chip may be realized in the form of a semiconductor package so as to be appropriately applied to an electronic product. In a typical semiconductor package, a semiconductor chip may be mounted on a printed circuit board and may be electrically connected to the printed circuit board through bonding wires or bumps. Various techniques for improving reliability of semiconductor packages have been studied with the development of an electronic industry.

SUMMARY

Embodiments of the inventive concepts may provide a semiconductor package with improved reliability and a method of manufacturing the same.

In an aspect, a semiconductor package may include a redistribution substrate, and a semiconductor chip disposed on a top surface of the redistribution substrate. The redistribution substrate may include under bump patterns laterally spaced apart from each other, a dummy pattern disposed between the under bump patterns, a passivation pattern disposed on a bottom surface of the dummy pattern, an insulating layer covering top surfaces and sidewalls of the under bump patterns and a sidewall and a top surface of the dummy pattern, and a redistribution pattern disposed on one of the under bump patterns and electrically connected to the one under bump pattern. The passivation pattern may include a different material from that of the insulating layer.

In an aspect, a semiconductor package may include a redistribution substrate, and a semiconductor chip disposed on a top surface of the redistribution substrate. The redistribution substrate may include an under bump pattern, a dummy pattern horizontally spaced apart from a sidewall of the under bump pattern, and a redistribution pattern disposed on a top surface of the under bump pattern and electrically connected to the under bump pattern. The redistribution pattern may include an interconnection portion extending in a direction parallel to the top surface of the under bump pattern, and a via portion disposed between the under bump pattern and the interconnection portion and being in contact with the top surface of the under bump pattern. An angle between a bottom surface and a sidewall of the dummy pattern may be less than an angle between a bottom surface and a sidewall of the via portion.

BRIEF DESCRIPTION OF THE DRAWINGS

The inventive concepts will become more apparent in view of the attached drawings and accompanying detailed description.

FIGS. 2A to 2F and 2H to 2P are cross-sectional views illustrating a method of manufacturing a semiconductor package, according to example embodiments of the inventive concepts.

FIG. 2G is an enlarged view of a region 'II' of FIG. 2F.

DETAILED DESCRIPTION OF THE EMBODIMENTS

Figure 1A:
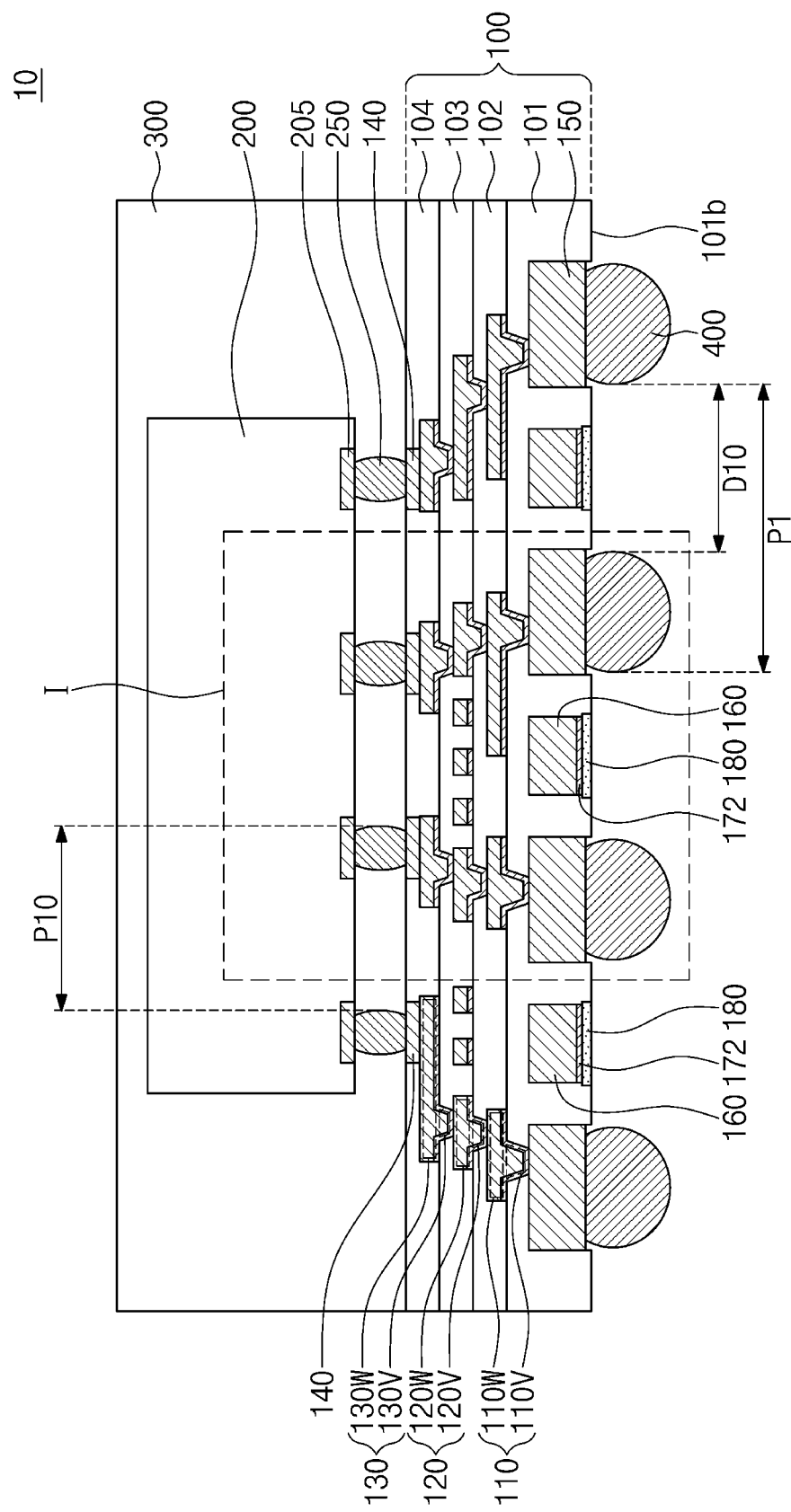
FIG. 1A is a cross-sectional view illustrating a semiconductor package, according to example embodiments of the inventive concepts.

The same reference numerals or the same reference designators may denote the same elements or components throughout the specification. A semiconductor package and a method of manufacturing the same according to embodiments of the inventive concepts will be described hereinafter.

Figure 1B:
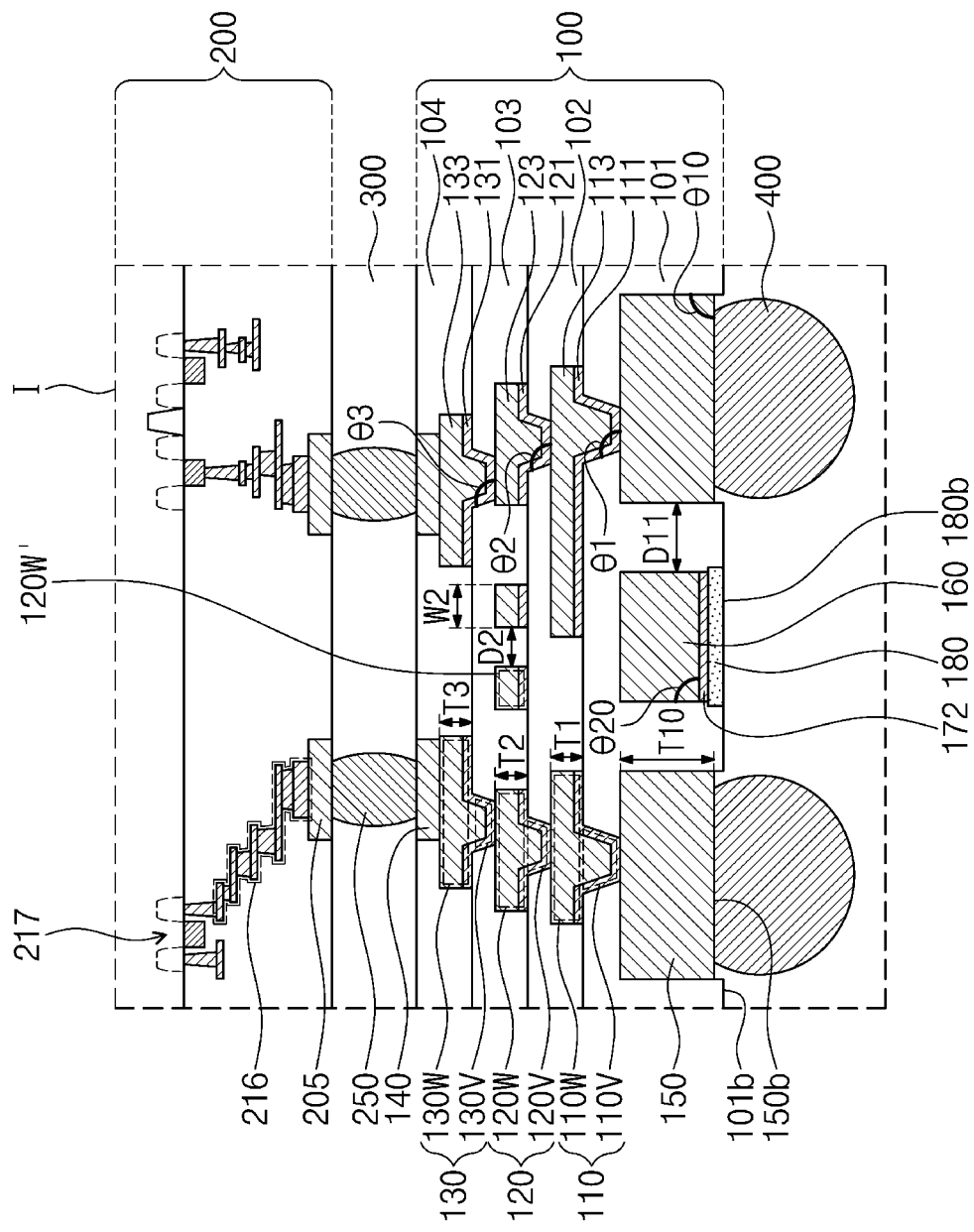
FIG. 1B is an enlarged view of a region 'I' of FIG. 1A.

FIG. 1A is a cross-sectional view illustrating a semiconductor package, according to example embodiments of the inventive concepts. FIG. 1B is an enlarged view of a region 'I' of FIG. 1A.

Referring to FIGS. 1A and 1B, a semiconductor package 10 may include a redistribution substrate 100 and a semiconductor chip 200. The redistribution substrate 100 may include an under bump pattern 150, a dummy pattern 160, a dummy seed pattern 172, a passivation pattern 180, a first redistribution pattern 110, a second redistribution pattern 120, a third redistribution pattern 130, a bonding pad 140, and insulating layers 101, 102, 103 and 104. The insulating layers 101, 102, 103 and 104 may include first to fourth insulating layers 101, 102, 103 and 104 which are sequentially stacked. The redistribution substrate 100 may be referred to as an interconnection structure.

The under bump pattern 150 may be provided in the first insulating layer 101. A bottom surface 150b of the under bump pattern 150 may not be covered by the first insulating layer 101. The under bump pattern 150 may function as a pad of a conductive terminal 400. The under bump pattern 150 may include a metal material such as copper. The under bump pattern 150 may not include, for example, titanium. A distance D10 between two under bump patterns 150 adjacent to each other in the horizontal direction may range from 30 μm to 80 μm.

The under bump pattern 150 may have a relatively thick thickness T10, as shown in FIG. 1B. If the thickness T10 of the under bump pattern 150 is less than 8 μm, high power characteristics of the semiconductor package 10 may be deteriorated. The thickness T10 of the under bump pattern 150 according to example embodiments may range from about 8 µm to about 20 µm. Thus, the semiconductor package 10 may have improved high power characteristics.

The dummy pattern 160 may be laterally spaced apart from a sidewall of the under bump pattern 150 in the first insulating layer 101. The dummy pattern 160 may be horizontally spaced apart from the under bump pattern 150. In the present specification, the term 'horizontal' may mean parallel to a bottom surface 101b of the first insulating layer 101 or a top surface of the under bump pattern 150. It may be understood that when two components are referred to as being laterally spaced apart from each other, they may be horizontally spaced apart from each other. The under bump pattern 150 may include a plurality of under bump patterns 150 laterally spaced apart from each other. The dummy pattern 160 may be disposed between the under bump patterns 150. As illustrated in FIG. 1B, a distance D11 in the horizontal direction between the dummy pattern 160 and the under bump pattern 150 may range from 5 µm to 10 µm. Here, the under bump pattern 150 may be referred to as a first under bump pattern. The first under bump pattern may be adjacent to the dummy pattern 160. Hereinafter, in the present specification, the distance D11 between the dummy pattern 160 and the under bump pattern 150 may mean the distance between the dummy pattern 160 and the first under bump pattern. If the distance D11 between the dummy pattern 160 and the under bump pattern 150 is less than 5 µm, reliability of the semiconductor package 10 may be deteriorated. However, according to the embodiments of the inventive concepts, the semiconductor package 10 may have high reliability even though the semiconductor package 10 is repeatedly operated. Hereinafter, a single under bump pattern 150 will be mainly described.

The dummy pattern 160 may include a conductive material such as a metal. The metal included in the dummy pattern 160 may be the same as the metal included in the under bump pattern 150. For example, the dummy pattern 160 may include copper. The dummy pattern 160 may be insulated from the under bump pattern 150, the first to third redistribution patterns 110, 120 and 130, and the semiconductor chip 200.

The passivation pattern 180 may be disposed on a bottom surface of the dummy pattern 160. A width of the passivation pattern 180 may be equal to or greater than a width of the dummy pattern 160. A bottom surface 180b of the passivation pattern 180 may be exposed by the first insulating layer 101. The passivation pattern 180 may include an insulating material. However, the passivation pattern 180 may include a different material from that of the first insulating layer 101. For example, the passivation pattern 180 may include, but not be limited to, a silicon-based insulating material (e.g., silicon oxide, silicon nitride, silicon oxynitride, silicon carbonitride, and/or silicon oxycarbide).

The dummy seed pattern 172 may be disposed between the passivation pattern 180 and the dummy pattern 160. The dummy seed pattern 172 may be in contact with the dummy pattern 160. In some embodiments, a width of the dummy seed pattern 172 may be the same as a width of the dummy pattern 160. The dummy seed pattern 172 may include a conductive material. For example, the dummy seed pattern 172 may include at least one of copper, titanium, or any alloy thereof. The passivation pattern 180 may prevent the dummy pattern 160 or the dummy seed pattern 172 from being exposed to the outside.

Terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. Herein, the terms "width" and "length" may refer to a distance measured in a direction parallel to a bottom surface 101b of the first insulating layer 101, and the term "thickness" may refer to the thickness or height measured in a direction perpendicular to the bottom surface 101b of the first insulating layer 101.

The first insulating layer 101 may cover the top surface and the sidewall of the under bump pattern 150, a sidewall of the passivation pattern 180, a sidewall of the dummy seed pattern 172, and a sidewall and a top surface of the dummy pattern 160. The first insulating layer 101 may be a lowermost insulating layer. As illustrated in FIG. 1B, the bottom surface 150b of the under bump pattern 150 may not be covered by the first insulating layer 101. The bottom surface 150b of the under bump pattern 150 may be disposed at a higher level than the bottom surface 101b of the first insulating layer 101. The bottom surface 101b of the first insulating layer 101 may be disposed at substantially the same level as a bottom surface 180b of the passivation pattern 180. For example, the bottom surface 101b of the first insulating layer 101 may be coplanar with the bottom surface 180b of the passivation pattern 180. In the present specification, the level may mean a vertical level, and a level difference may be measured in a direction perpendicular to the bottom surface 101b of the first insulating layer 101. For example, the first insulating layer 101 may include an organic material such as a photosensitive polymer. In the present specification, the photosensitive polymer may include at least one of, for example, photosensitive polyimide, polybenzoxazole, a phenol-based polymer, or a benzocyclobutene-based polymer. The first insulating layer 101 may be, but not be limited to, a positive type photosensitive polymer.

The first redistribution pattern 110 may be provided on the under bump pattern 150. The first redistribution pattern 110 may include a first via portion 110V and a first interconnection portion 110W. The first via portion 110V may be disposed in the first insulating layer 101. The first via portion 110V may be disposed between the under bump pattern 150 and the first interconnection portion 110W. The first via portion 110V may be in direct contact with the top surface of the under bump pattern 150. A width of the first via portion 110V may be less than a width of the under bump pattern 150. An angle θ10 between the bottom surface 150b and the sidewall of the under bump pattern 150 may be less than a first angle θ1 between a bottom surface and a sidewall of the first via portion 110V. For example, the first angle θ1 may range from 120 degrees to 135 degrees. The angle θ10 between the bottom surface 150b and the sidewall of the under bump pattern 150 may range from 80 degrees to 100 degrees. In particular, the angle θ10 between the bottom surface 150b and the sidewall of the under bump pattern 150 may range from 85 degrees to 95 degrees. The first angle θ1 may be greater than an angle θ20 between a bottom surface and the sidewall of the dummy pattern 160. The angle θ20 between the bottom surface and the sidewall of the dummy pattern 160 may range from 80 degrees to 100 degrees. In particular, the angle θ20 between the bottom surface and the sidewall of the dummy pattern 160 may range from 85 degrees to 95 degrees.

The first interconnection portion 110W may be provided on the first via portion 110V and may be connected to the first via portion 110V. The first interconnection portion 110W may have a width or length greater than that of the first via portion 110V. The first interconnection portion 110W may extend onto a top surface of the first insulating layer 101 and may have a long axis extending in a first direction. The first direction may be parallel to the bottom surface 101b of the first insulating layer 101. For example, a top surface of the first interconnection portion 110W may be substantially parallel to the bottom surface 101b of the first insulating layer 101 or the top surface of the under bump pattern 150. At least a portion of the first interconnection portion 110W may be disposed on the top surface of the dummy pattern 160 and may be vertically spaced apart from the top surface of the dummy pattern 160. A thickness T1 of the first interconnection portion 110W may range from 3 μm to 5 μm.

The first redistribution pattern 110 may include a first seed pattern 111 and a first conductive layer 113. The first conductive layer 113 may be disposed on the top surface of the first insulating layer 101 and in the first insulating layer 101. For example, portions of the first conductive layer 113 may be below a top surface of the first insulating layer 101. The first conductive layer 113 may not be in direct contact with the under bump pattern 150. The first conductive layer 113 may be in direct contact with a top surface of the first seed pattern 111. The first conductive layer 113 may include a metal such as copper. The first seed pattern 111 may be disposed between the under bump pattern 150 and the first conductive layer 113 and between the first insulating layer 101 and the first conductive layer 113. The first seed pattern 111 may be in direct contact with the under bump pattern 150. The first seed pattern 111 may include a conductive material such as copper, titanium, and/or any alloy thereof.

Each of the first via portion 110V and the first interconnection portion 110W may include the first seed pattern 111 and the first conductive layer 113. The first seed pattern 111 of the first via portion 110V may be connected directly to the first seed pattern 111 of the first interconnection portion 110W without an interface therebetween. For example, the first seed pattern 111 of the first via portion 110V and the first seed pattern 111 of the first interconnection portion 110W may be in material continuity with one another. The first seed pattern 111 may be provided between a bottom surface of the first conductive layer 113 of the first via portion 110V and the under bump pattern 150 and may be disposed between a sidewall of the first conductive layer 113 of the first via portion 110V and the first insulating layer 101 and between a bottom surface of the first conductive layer 113 of the first interconnection portion 110W and the first insulating layer 101. The first seed pattern 111 may not extend onto a sidewall and a top surface of the first conductive layer 113 of the first interconnection portion 110W. The first conductive layer 113 of the first via portion 110V may be connected directly to the first conductive layer 113 of the first interconnection portion 110W without an interface therebetween. For example, the first conductive layer 113 of the first via portion 110V and the first conductive layer 113 of the first interconnection portion 110W may be in material continuity with one another. As used herein, the term "material continuity" may refer to structures, patterns, and/or layers that are formed at the same time and of the same material, without a break in the continuity of the material of which they are formed. As one example, structures, patterns, and/or layers that are in "material continuity" may be homogeneous monolithic structures.

The second insulating layer 102 may be disposed on the first insulating layer 101 and may cover the top surface of the first insulating layer 101 and the top surface and the sidewall of the first interconnection portion 110W. The second insulating layer 102 may be in contact with at least a portion of the top surface of the first conductive layer 113. The second insulating layer 102 may be in contact with side surfaces of the first seed pattern 111 and the first conductive layer 113. For example, the second insulating layer 102 may include a photosensitive polymer. An interface between the first and second insulating layers 101 and 102 may not be observed. However, embodiments of the inventive concepts are not limited thereto.

The second redistribution pattern 120 may be disposed on the first redistribution pattern 110 and may be electrically connected to the first redistribution pattern 110. The second redistribution pattern 120 may include a second interconnection portion 120W and a second via portion 120V. The second via portion 120V may be provided in the second insulating layer 102. The angle θ10 between the bottom surface 150b and the sidewall of the under bump pattern 150 may be less than a second angle θ2 between a bottom surface and a sidewall of the second via portion 120V. The angle θ20 between the bottom surface and the sidewall of the dummy pattern 160 may be less than the second angle θ2. For example, the second angle θ2 may range from 120 degrees to 135 degrees.

The second interconnection portion 120W may be disposed on the second via portion 120V and the top surface of the second insulating layer 102. The second via portion 120V may be disposed between the first redistribution pattern 110 and the second interconnection portion 120W. The second interconnection portion 120W may be electrically connected to the second via portion 120V. The second interconnection portion 120W may have a long axis parallel to the first direction. A top surface of the second interconnection portion 120W may be substantially parallel to the bottom surface 101b of the first insulating layer 101 or the top surface of the under bump pattern 150. A thickness T2 of the second interconnection portion 120W may range from 3 μm to 5 μm.

The second redistribution pattern 120 may include a second seed pattern 121 and a second conductive layer 123. For example, each of the second via portion 120V and the second interconnection portion 120W of the second redistribution pattern 120 may include the second seed pattern 121 and the second conductive layer 123. The second seed pattern 121 of the second via portion 120V may be connected directly to the second seed pattern 121 of the second interconnection portion 120W without an interface therebetween, and the second conductive layer 123 of the second via portion 120V may be connected directly to the second conductive layer 123 of the second interconnection portion 120W without an interface therebetween. For example, the second seed pattern 121 of the second via portion 120V and the second seed pattern 121 of the second interconnection portion 120W may be in material continuity with one another, and the second conductive layer 123 of the second via portion 120V and the second conductive layer 123 of the second interconnection portion 120W may be in material continuity with one another.

The second conductive layer 123 may be disposed on the top surface of the second insulating layer 102 and in the second insulating layer 102. For example, portions of the second conductive layer 123 may be below a top surface of the second insulating layer 102. The second conductive layer 123 may be in direct contact with a top surface of the second seed pattern 121. The second seed pattern 121 may be disposed between the first redistribution pattern 110 and the second conductive layer 123 and between the second insulating layer 102 and the second conductive layer 123. The second seed pattern 121 may be in direct contact with the first redistribution pattern 110. The second seed pattern 121 may be provided on a bottom surface of the second conductive layer 123 of the second via portion 120V and may be disposed between a sidewall of the second conductive layer 123 of the second via portion 120V and the second insulating layer 102 and between a bottom surface of the second conductive layer 123 of the second interconnection portion 120W and the second insulating layer 102. The second seed pattern 121 may not extend onto a sidewall and a top surface of the second conductive layer 123 of the second interconnection portion 120W. The second seed pattern 121 may include the material described as the example of the first seed pattern 111. The second conductive layer 123 may include the material described as the example of the first conductive layer 113.

The third insulating layer 103 may be disposed on the second insulating layer 102 and may cover the top surface of the second insulating layer 102 and the sidewall and the top surface of the second interconnection portion 120W. The third insulating layer 103 may be in direct contact with at least a portion of the top surface of the second conductive layer 123. For example, the third insulating layer 103 may include a photosensitive polymer. The third insulating layer 103 may include the same material as the second insulating layer 102. An interface between the third and second insulating layers 103 and 102 may not be observed. However, embodiments of the inventive concepts are not limited thereto.

The third redistribution pattern 130 may be disposed on the second redistribution pattern 120 and may be electrically connected to the second redistribution pattern 120. The third redistribution pattern 130 may include a third interconnection portion 130W and a third via portion 130V. The third via portion 130V may be provided in the third insulating layer 103. The third via portion 130V may be disposed between the second redistribution pattern 120 and the third interconnection portion 130W. The angle θ10 between the bottom surface 150b and the sidewall of the under bump pattern 150 may be less than a third angle θ3 between a bottom surface and a sidewall of the third via portion 130V. The third angle θ3 may be greater than the angle θ20 between the bottom surface and the sidewall of the dummy pattern 160. For example, the third angle θ3 may range from 120 degrees to 135 degrees.

The third interconnection portion 130W may be disposed on the third via portion 130V and the top surface of the third insulating layer 103. The third interconnection portion 130W may be electrically connected to the third via portion 130V. A top surface of the third interconnection portion 130W may be substantially parallel to the bottom surface 101b of the first insulating layer 101 or the top surface of the under bump pattern 150. A thickness T3 of the third interconnection portion 130W may range from 3 μm to 5 μm.

The third redistribution pattern 130 may include a third seed pattern 131 and a third conductive layer 133. For example, each of the third via portion 130V and the third interconnection portion 130W of the third redistribution pattern 130 may include the third seed pattern 131 and the third conductive layer 133. The third seed pattern 131 of the third via portion 130V may be connected directly to the third seed pattern 131 of the third interconnection portion 130W without an interface therebetween, and the third conductive layer 133 of the third via portion 130V may be connected directly to the third conductive layer 133 of the third interconnection portion 130W without an interface therebetween. For example, the third seed pattern 131 of the third via portion 130V and the third seed pattern 131 of the third interconnection portion 130W may be in material continuity with one another, and the third conductive layer 133 of the third via portion 130V and the third conductive layer 133 of the third interconnection portion 130W may be in material continuity with one another.

The third conductive layer 133 may be disposed on the top surface of the third insulating layer 103 and in the third insulating layer 103. For example, portions of the third conductive layer 133 may be below a top surface of the third insulating layer 103. The third conductive layer 133 may be in direct contact with a top surface of the third seed pattern 131. The third seed pattern 131 may be disposed between the second redistribution pattern 120 and the third conductive layer 133 and between the third conductive layer 133 and the third insulating layer 103. The third seed pattern 131 may be in direct contact with the second redistribution pattern 120. The third seed pattern 131 may be provided on a bottom surface of the third conductive layer 133 of the third via portion 130V and may be disposed between a sidewall of the third conductive layer 133 of the third via portion 130V and the third insulating layer 103 and between a bottom surface of the third conductive layer 133 of the third interconnection portion 130W and the third insulating layer 103. The third seed pattern 131 may not extend onto a sidewall and a top surface of the third conductive layer 133 of the third interconnection portion 130W. The third seed pattern 131 may include the material described as the example of the first seed pattern 111. The third conductive layer 133 may include the material described as the example of the first conductive layer 113.

The thickness T10 of the under bump pattern 150 may be relatively great. For example, the thickness T10 of the under bump pattern 150 may be greater than each of the thickness T1 of the first interconnection portion 110W, the thickness T2 of the second interconnection portion 120W, and the thickness T3 of the third interconnection portion 130W. Thus, the semiconductor package 10 may have high power characteristics. In some embodiments, the thickness T10 of the under bump pattern 150 may be greater than a combination of the thickness T1 of the first interconnection portion 110W, the thickness T2 of the second interconnection portion 120W, and the thickness T3 of the third interconnection portion 130W.

The first redistribution pattern 110 may be provided in plurality. The second redistribution pattern 120 may be provided in plurality. The third redistribution pattern 130 may be provided in plurality.

If the dummy pattern 160 is omitted, the top surface of the first insulating layer 101 may have an undulation due to the thickness T10 of the under bump pattern 150. In this case, the top surfaces of a plurality of the first interconnection portions 110W may be disposed at different levels from each other. For example, a level difference between an uppermost one and a lowermost one of the top surfaces of the first interconnection portions 110W may range from 3 μm to 5 μm. Likewise, the top surfaces of the second and third insulating layers 102 and 103 may have undulations. In this case, the top surfaces of a plurality of the second interconnection portions 120W may be disposed at excessively different levels from each other. The top surfaces of a plurality of the third interconnection portions 130W may be disposed at excessively different levels from each other. Failure in electrical connection between the first to third redistribution patterns 110, 120 and 130 may occur by the level difference between the first interconnection portions 110W, the level difference between the second interconnection portions 120W, and/or the level difference between the third interconnection portions 130W.

According to the example embodiments of the inventive concepts, the dummy pattern 160 may be disposed between a plurality of the under bump patterns 150. The dummy pattern 160 may be provided in plurality, and each of the plurality of dummy patterns 160 may be disposed between the under bump patterns 150 adjacent to each other. For example, the dummy patterns 160 and the under bump patterns 150 may be alternately arranged. A thickness of each of the dummy patterns 160 may be equal or similar to the thickness T10 of each of the under bump patterns 150. A top surface of the dummy pattern 160 may be disposed at the same or similar level as the top surfaces of the under bump patterns 150. The first insulating layer 101 may be provided on the top surface of the dummy pattern 160 and the top surfaces of the under bump patterns 150. An undulation of the top surfaces of the first redistribution patterns 110, an undulation of the top surfaces of the second redistribution patterns 120 and an undulation of the top surfaces of the third redistribution patterns 130 may be reduced or prevented by the dummy pattern 160. For example, a level difference between an uppermost one and a lowermost one of the top surfaces of the first redistribution patterns 110 may be less than 1 μm. A level difference between an uppermost one and a lowermost one of the top surfaces of the second redistribution patterns 120 may be less than 1 μm. A level difference between an uppermost one and a lowermost one of the top surfaces of the third redistribution patterns 130 may be less than 1 μm. Here, a case in which a level difference between two portions is less than 1 μm may include a case in which the level difference between the two portions is 0 (zero). For example, the case in which the level difference between the two portions is less than 1 μm may include a case in which the two portions are disposed at substantially the same level. Thus, electrical connection between the first to third redistribution patterns 110, 120 and 130 may be excellent.

If the thickness T10 of the under bump pattern 150 is greater than 20 μm, at least one of the first to third redistribution patterns 110, 120 and 130 may have a relatively great undulation. However, according to the embodiments of the inventive concepts, the thickness T10 of the under bump pattern 150 may range from 8 μm to 20 μm. Thus, occurrence of excessive undulations of the first to third redistribution patterns 110, 120 and 130 may be prevented.

If the distance D11 between the dummy pattern 160 and the under bump pattern 150 is greater than 10 μm, it may be difficult to sufficiently reduce occurrence of undulations of the first to third redistribution patterns 110, 120 and 130. However, according to the embodiments of the inventive concepts, the distance D11 between the dummy pattern 160 and the under bump pattern 150 may range from 5 μm to 10 μm. Thus, each of the first to third redistribution patterns 110, 120 and 130 may not have an undulation or may have a reduced undulation.

As widths and distances of the first to third interconnection portions 110W, 120W and 130W decrease, undulations and electrical connection failures of the first to third redistribution patterns 110, 120 and 130 may occur more easily. In this case, there may be limitations on widths, distances and/or arrangement of the first to third interconnection portions 110W, 120W and 130W. However, according to the embodiments of the inventive concepts, since the dummy pattern 160 is provided, the limitations on widths, distances, and/or arrangements of the first to third interconnection portions 110W, 120W and 130W may be reduced. For example, the second redistribution pattern 120 may include second fine interconnection portions 120W'. The second fine interconnection portions 120W' may be disposed on the top surface of the second insulating layer 102. Each of the second fine interconnection portions 120W' may include the second seed pattern 121 and the second conductive layer 123. Even though not shown in the drawings, each of the second fine interconnection portions 120W' may be connected to the second interconnection portion 120W or the second via portion 120V. The second fine interconnection portions 120W' and the second interconnection portion 120W may be formed by a single process. Widths W2 of the second fine interconnection portions 120W' may range from 0.01 μm to 5 μm. A distance D2 in the horizontal direction between the second fine interconnection portions 120W' may range from 0.01 μm to 5 μm. The second fine interconnection portions 120W' may vertically overlap with the dummy pattern 160.

The fourth insulating layer 104 may be disposed on the third insulating layer 103 and may cover the top surface of the third insulating layer 103 and the sidewall of the third interconnection portion 130W. For example, the fourth insulating layer 104 may include a photosensitive polymer. The fourth insulating layer 104 may include the same material as the third insulating layer 103. An interface between the third and fourth insulating layers 103 and 104 may not be observed. However, embodiments of the inventive concepts are not limited thereto.

The bonding pad 140 may be disposed on the top surface of the third redistribution pattern 130. The bonding pad 140 may be connected to the third redistribution pattern 130. The bonding pad 140 may include a conductive material. For example, the bonding pad 140 may include a metal material such as copper, titanium, aluminum, tungsten, and/or any alloy thereof. Although not shown in the drawings, a protective layer may be provided on the third insulating layer 103 to cover a sidewall of the bonding pad 140. The number of the stacked insulating layers 101, 102, 103 and 104 and the number of the redistribution patterns 110, 120 and 130 are not limited to FIGS. 1A and 1B but may be variously changed or modified.

The semiconductor chip 200 may be mounted on a top surface of the redistribution substrate 100. The semiconductor chip 200 may include a chip pad 205, integrated circuits 217, and a connection structure 216, as illustrated in FIG. 1B. The chip pad 205 may be exposed at a bottom surface of the semiconductor chip 200. The integrated circuits 217 may be provided in the semiconductor chip 200. The integrated circuits 217 may include a memory circuit, a logic circuit, and/or a combination thereof. The connection structure 216 may be disposed between the chip pad 205 and the integrated circuits 217. The connection structure 216 may include internal metal interconnection lines and metal vias. The chip pad 205 may be electrically connected to the integrated circuits 217 through the connection structure 216. It may be understood that when a component is referred to as being connected to the chip pad 205, it may be connected to the semiconductor chip 200. It may be understood that when a component is referred to as being connected to the semiconductor chip 200, it may be connected to the integrated circuits 217 of the semiconductor chip 200. Hereinafter, the integrated circuits 217 and the connection structure 216 are omitted in other drawings except FIG. 1B for the purpose of ease and convenience in illustration.

A bonding terminal 250 may be provided between the chip pad 205 of the semiconductor chip 200 and the bonding pad 140 of the redistribution substrate 100 and may be electrically connected to the chip pad 205 and the bonding pad 140. The bonding terminal 250 may be a plurality of bonding terminals 250, and each bonding terminal 250 may be electrically connected to a corresponding one of the bonding pads 140. The bonding terminal 250 may include at least one of a solder ball, a pillar, or a bump. The bonding terminal 250 may include a conductive material such as a solder material. For example, the solder material may include tin, bismuth, lead, silver, or any alloy thereof. The semiconductor chip 200 may be electrically connected to the redistribution substrate 100 through the bonding terminal 250. In the present specification, it may be understood that when a component is referred to as being electrically connected to the redistribution substrate 100, it may be electrically connected to at least one of the first to third redistribution patterns 110, 120, and 130.

The semiconductor package 10 may further include a molding layer 300. The molding layer 300 may be disposed on the redistribution substrate 100 to cover the semiconductor chip 200. The molding layer 300 may cover an uppermost one of the first to fourth insulating layers 101, 102, 103, and 104. The uppermost insulating layer may be the fourth insulating layer 104. The molding layer 300 may extend into a gap between the semiconductor chip 200 and the redistribution substrate 100 to seal or surround the bonding terminals 250. For example, the molding layer 300 may include an insulating polymer such as an epoxy molding compound (EMC). In certain embodiments, even though not shown in the drawings, an underfill layer may be provided in the gap between the redistribution substrate 100 and the semiconductor chip 200.

The conductive terminal 400 may be disposed on a bottom surface of the redistribution substrate 100. For example, the conductive terminal 400 may be disposed on the bottom surface 150b of the under bump pattern 150 and may be electrically connected to the under bump pattern 150. The conductive terminal 400 may be in direct contact with the under bump pattern 150. Thus, the conductive terminal 400 may be electrically connected to the semiconductor chip 200 through the first to third redistribution patterns 110, 120, and 130 and the bonding terminal 250. The conductive terminal 400 may be a plurality of conductive terminals 400, and each conductive terminal 400 may be electrically connected to a corresponding one of the under bump patterns 150. The conductive terminals 400 may include a solder ball, a bump, a pillar, and/or a combination thereof. The conductive terminal 400 may include a solder material. The conductive terminal 400 may be spaced apart from a bottom surface of the dummy pattern 160. The conductive terminal 400 may be insulated from the dummy pattern 160. Even though an error occurs in a process of forming the conductive terminal 400, the passivation pattern 180 may prevent the conductive terminal 400 from being in contact with the dummy seed pattern 172. This relation of the conductive terminal 400 and the passivation pattern 180 will be described in more detail with reference to FIG. 1C. As illustrated in FIG. 1A, a pitch P1 of a plurality of the conductive terminals 400 may be greater than a pitch P10 of a plurality of the bonding terminals 250.

Figure 1C:
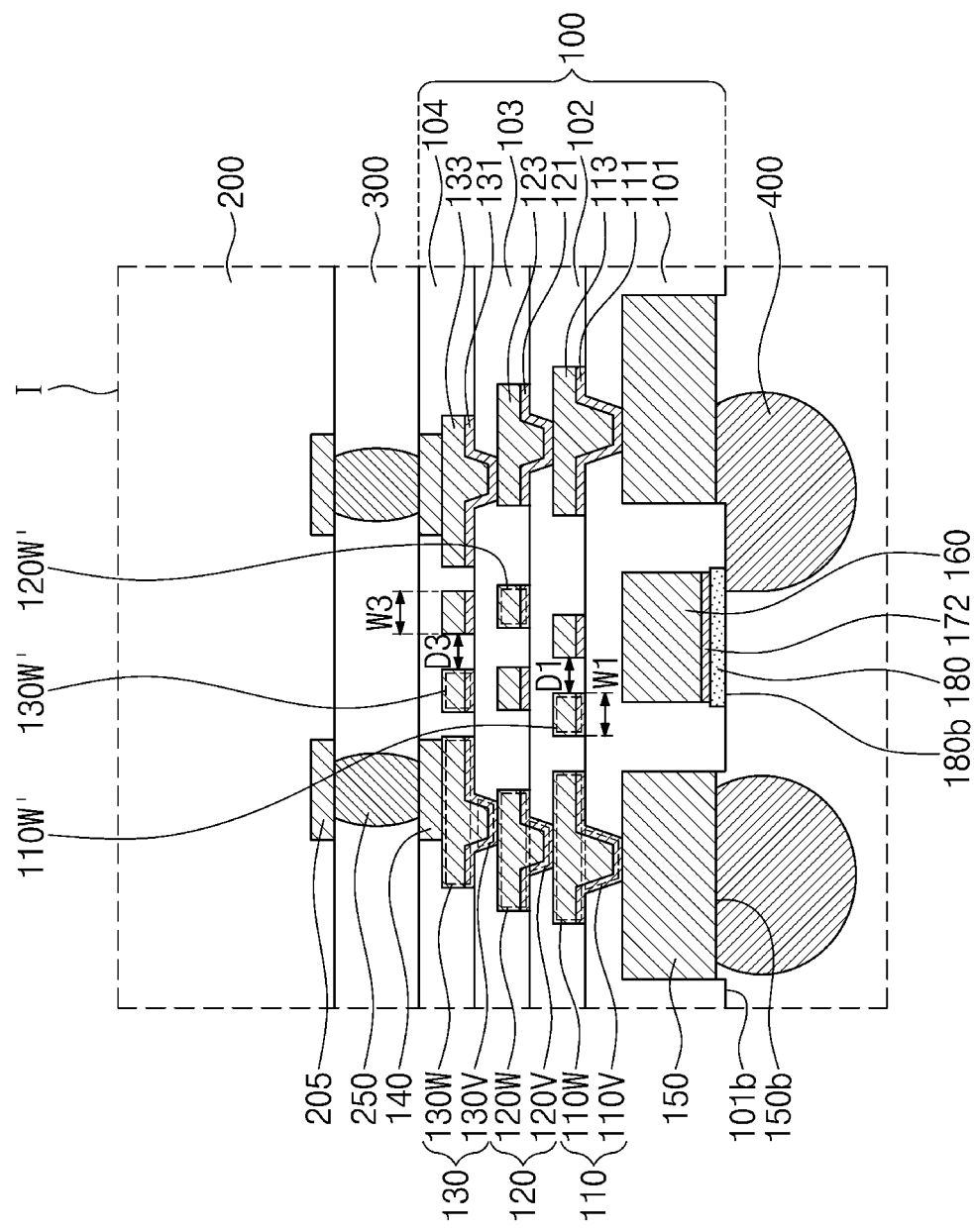
FIG. 1C is an enlarged view illustrating a redistribution substrate, according to example embodiments of the inventive concepts.

FIG. 1C is an enlarged view corresponding to the region 'I' of FIG. 1A to illustrate a redistribution substrate, according to example embodiments of the inventive concepts. Hereinafter, the descriptions to the same components and/or features as in the above embodiments will be omitted for the purpose of ease and convenience in explanation.

Referring to FIG. 1C, a redistribution substrate 100 may include first to fourth insulating layers 101, 102, 103, and 104, an under bump pattern 150, a dummy pattern 160, a dummy seed pattern 172, a passivation pattern 180, a first redistribution pattern 110, a second redistribution pattern 120, a third redistribution pattern 130, and a bonding pad 140. The first to fourth insulating layers 101, 102, 103, and 104, the under bump pattern 150, the dummy pattern 160, the dummy seed pattern 172, the passivation pattern 180, the first to third redistribution patterns 110, 120, and 130, the bonding pad 140, and the second fine interconnection portions 120W' may be substantially the same as described with reference to FIGS. 1A and 1B.

However, the first redistribution pattern 110 may further include first fine interconnection portions 110W'. The first fine interconnection portions 110W' may be disposed on the top surface of the first insulating layer 101. Each of the first fine interconnection portions 110W' may include the first seed pattern 111 and the first conductive layer 113. Even though not shown in the drawings, each of the first fine interconnection portions 110W' may be connected to the first interconnection portion 110W or the first via portion 110V. The first fine interconnection portions 110W' and the first interconnection portion 110W may be formed by a single process. Widths W1 of the first fine interconnection portions 110W' may range from 0.01 μm to 5 μm. A distance D1 in the horizontal direction between the first fine interconnection portions 110W' may range from 0.01 μm to 5 μm. At least a portion of the first fine interconnection portions 110W' may vertically overlap with the dummy pattern 160.

The third redistribution pattern 130 may further include third fine interconnection portions 130W'. The third fine interconnection portions 130W' may be disposed on the top surface of the third insulating layer 103. Each of the third fine interconnection portions 130W' may include the third seed pattern 131 and the third conductive layer 133. Even though not shown in the drawings, each of the third fine interconnection portions 130W' may be connected to the third interconnection portion 130W or the third via portion 130V. Widths W3 of the third fine interconnection portions 130W' may range from 0.01 μm to 5 μm. A distance D3 in the horizontal direction between the third fine interconnection portions 130W' may range from 0.01 μm to 5 μm. At least a portion of the third fine interconnection portions 130W' may vertically overlap with the dummy pattern 160. Unlike FIG. 1C, one of the first fine interconnection portions 110W', the second fine interconnection portions 120W' and the third fine interconnection portions 130W' may be omitted.

The conductive terminal 400 may be formed by a process of attaching a solder ball. Even though a portion of the conductive terminal 400 is provided on the bottom surface of the dummy pattern 160 by a process error in the process of forming the conductive terminal 400, the passivation pattern 180 may prevent contact between the dummy seed pattern 172 and the conductive terminal 400. Thus, the dummy pattern 160 may be insulated from the conductive terminal 400.

Figure 1D:
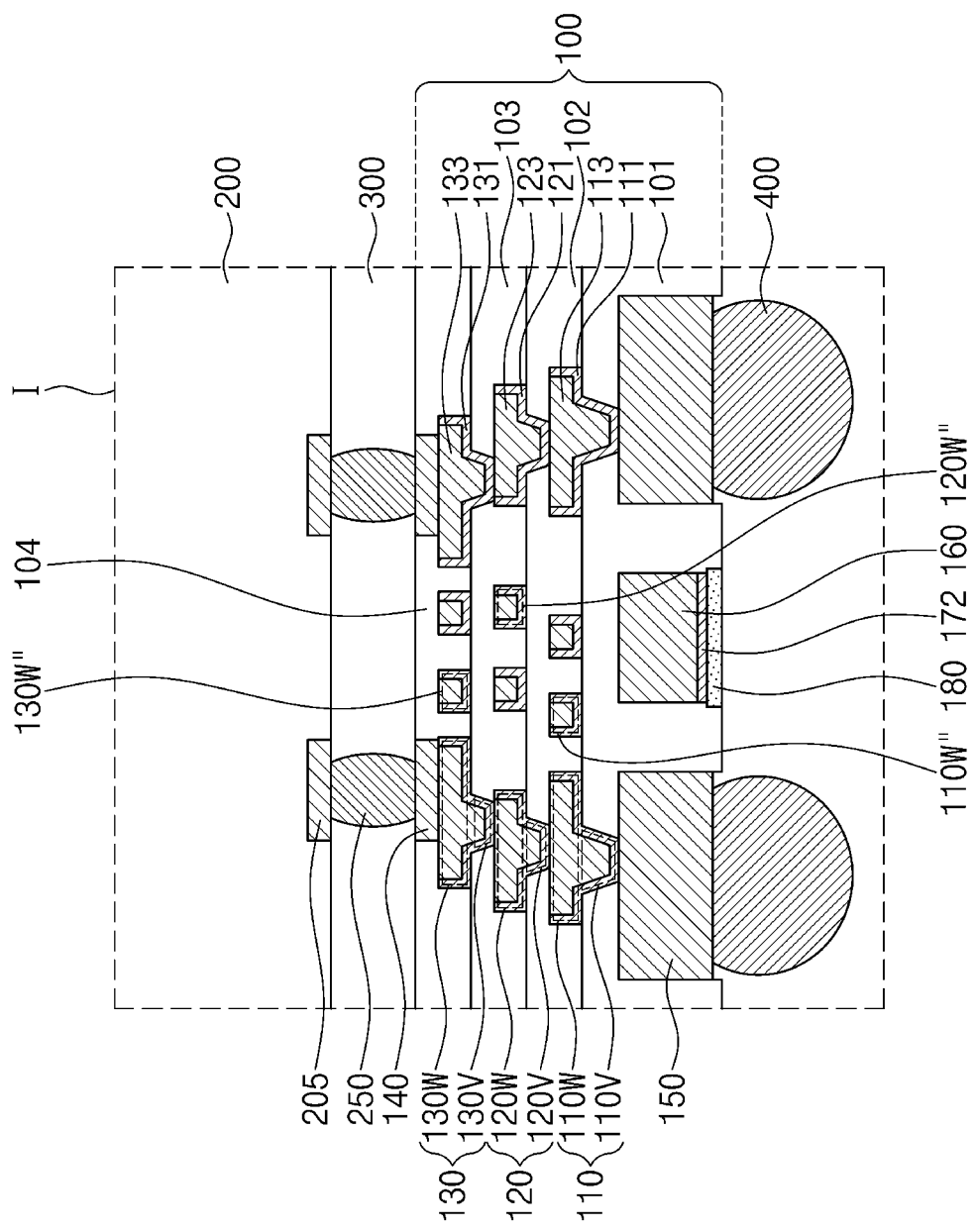
FIG. 1D is an enlarged view illustrating a redistribution substrate, according to example embodiments of the inventive concepts.

FIG. 1D is an enlarged view corresponding to the region 'I' of FIG. 1A to illustrate a redistribution substrate, according to example embodiments of the inventive concepts.

Hereinafter, the descriptions to the same components and/or features as in the above embodiments will be omitted for the purpose of ease and convenience in explanation.

Referring to FIG. 1D, a redistribution substrate 100 may include first to fourth insulating layers 101, 102, 103, and 104, an under bump pattern 150, a dummy pattern 160, a dummy seed pattern 172, a passivation pattern 180, first to third redistribution patterns 110, 120, and 130, and a bonding pad 140. The first to fourth insulating layers 101, 102, 103, and 104, the under bump pattern 150, the dummy pattern 160, the dummy seed pattern 172, the passivation pattern 180, the first to third redistribution patterns 110, 120, and 130 and the bonding pad 140 may be substantially the same as described with reference to FIGS. 1A and 1B. However, the first to fourth insulating layers 101, 102, 103, and 104 may include a negative type photosensitive polymer.

In the first interconnection portion 110W" of the first redistribution pattern 110, the first seed pattern 111 may further extend onto the sidewall of the first conductive layer 113. The first seed pattern 111 may be provided between the sidewall of the first conductive layer 113 and the second insulating layer 102.

In the second interconnection portion 120W" of the second redistribution pattern 120, the second seed pattern 121 may further extend onto the sidewall of the second conductive layer 123. The second seed pattern 121 may be provided between the sidewall of the second conductive layer 123 and the third insulating layer 103.

In the third interconnection portion 130W" of the third redistribution pattern 130, the third seed pattern 131 may further extend onto the sidewall of the third conductive layer 133. The third seed pattern 131 may be provided between the sidewall of the third conductive layer 133 and the fourth insulating layer 104.

One of the first fine interconnection portions 110W", the second fine interconnection portions 120W" and the third fine interconnection portions 130W" may be omitted.

Figure 2C:
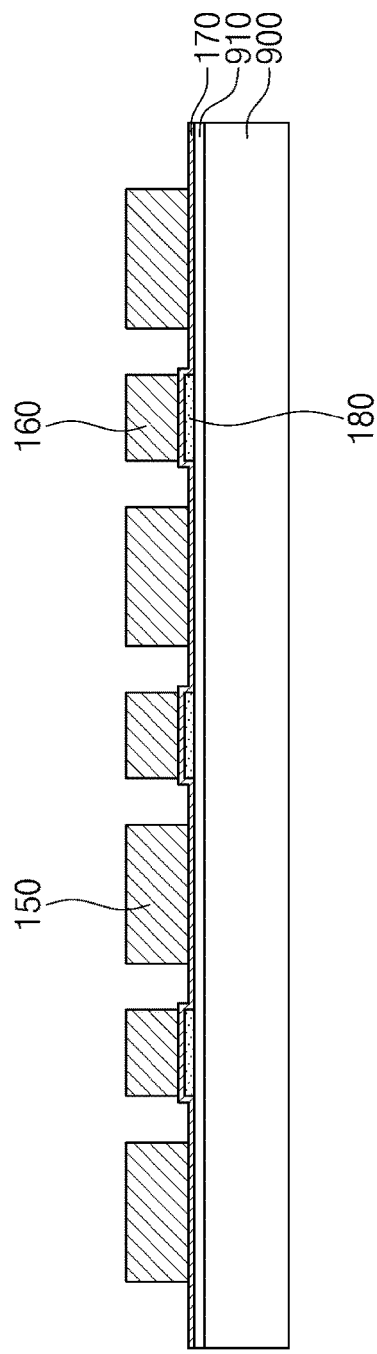

FIGS. 2A to 2F and 2H to 2P are cross-sectional views illustrating a method of manufacturing a semiconductor package, according to example embodiments of the inventive concepts. FIG. 2G is an enlarged view of a region 'II' of FIG. 2F. Hereinafter, the descriptions to the same features as described above will be omitted for the purpose of ease and convenience in explanation.

Referring to FIG. 2A, a passivation pattern 180, a lower seed layer 170, and a first resist pattern 191 may be formed on a carrier substrate 900. A release layer 910 may be formed between the carrier substrate 900 and the passivation pattern 180 and between the carrier substrate 900 and the lower seed layer 170. The release layer 910 may adhere the lower seed layer 170 and the passivation pattern 180 to the carrier substrate 900.

The formation of the passivation pattern 180 may include forming a preliminary passivation layer by depositing an insulating material, and performing an etching process on the preliminary passivation layer. The deposition of the insulating material may be performed by, but not be limited to, a chemical vapor deposition (CVD) process. The etching process of the preliminary passivation layer may include a dry etching process. The passivation pattern 180 may be formed in plurality, and the plurality of passivation patterns 180 may be laterally spaced apart from each other. Hereinafter, a single passivation pattern 180 will be mainly described.

The lower seed layer 170 may be formed on the carrier substrate 900 to cover a top surface of the release layer 910 and the passivation patterns 180. For example, the lower seed layer 170 may conformally cover sidewalls and top surfaces of the passivation patterns 180. The lower seed layer 170 may be formed by a deposition process. The lower seed layer 170 may include a conductive material. For example, the lower seed layer 170 may include at least one of copper, titanium, or any alloy thereof.

The first resist pattern 191 may be formed on a top surface of the lower seed layer 170. The first resist pattern 191 may vertically overlap with edge portions of the passivation pattern 180. First lower openings 1911 and second lower openings 1912 may be formed in the first resist pattern 191 and may expose the top surface of the lower seed layer 170. The first lower openings 1911 may not vertically overlap with the passivation pattern 180. The second lower openings 1912 may vertically overlap with the passivation pattern 180. Each second lower opening 1912 may be disposed between the first lower openings 1911 adjacent to each other. An additional hardening process may not be performed in the process of forming the first resist pattern 191 and the process of forming the first and second lower openings 1911 and 1912. Thus, an angle between a bottom surface and a sidewall of each of the first and second lower openings 1911 and 1912 may range from 80 degrees to 100 degrees. The first resist pattern 191 may include a photoresist material.

Referring to FIG. 2B, under bump patterns 150 and dummy patterns 160 may be formed in the first lower openings 1911 and the second lower openings 1912, respectively, and may cover the lower seed layer 170. The under bump patterns 150 and the dummy patterns 160 may be formed by performing an electroplating process using the lower seed layer 170 as an electrode. The electroplating process may be finished before the under bump patterns 150 and the dummy patterns 160 extend onto a top surface of the first resist pattern 191. Thus, an additional planarization process may not be required in the process of forming the under bump patterns 150 and the dummy patterns 160. Since the under bump patterns 150 and the dummy patterns 160 are formed using the first resist pattern 191, an angle θ10 between a bottom surface and a sidewall of each of the under bump patterns 150 may range from 80 degrees to 100 degrees. An angle θ20 between a bottom surface and a sidewall of the dummy pattern 160 may range from 80 degrees to 100 degrees. The under bump patterns 150 and the dummy patterns 160 may be formed by a single process. Thicknesses T10 of the under bump patterns 150 may be substantially equal to a thickness T20 of the dummy patterns 160.

Referring to FIG. 2C, the first resist pattern 191 may be removed to expose the top surface of a first portion of the lower seed layer 170, the sidewalls of the under bump patterns 150, and the sidewalls of the dummy patterns 160. The first resist pattern 191 may be removed by a strip process.

Figure 2D:
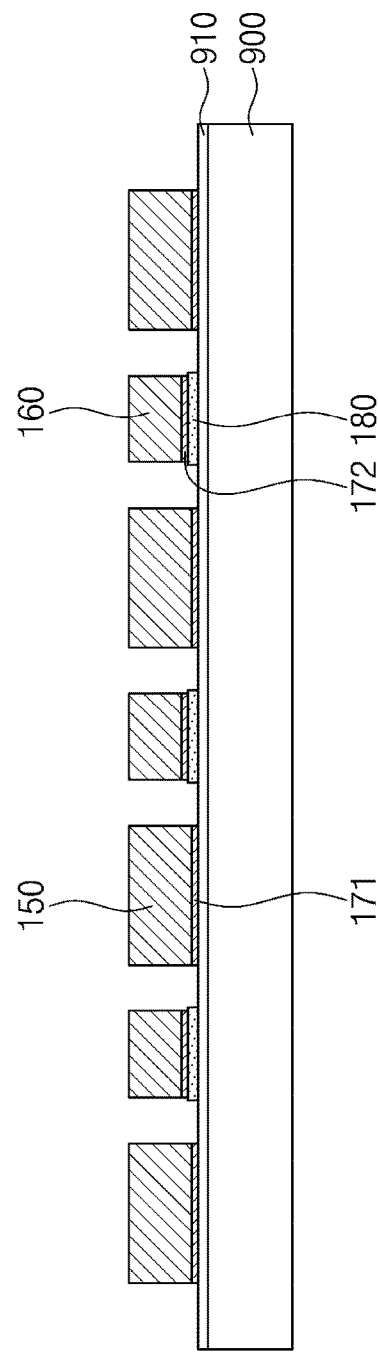

Referring to FIGS. 2C and 2D, under bump seed patterns 171 and a dummy seed pattern 172 may be formed by patterning the lower seed layer 170. The patterning of the lower seed layer 170 may include etching the exposed first portion of the lower seed layer 170. Thus, the first portion of the lower seed layer 170 may be removed, and a top surface of the release layer 910 and the sidewall of the passivation pattern 180 may be exposed. In the etching process, the under bump patterns 150 and the dummy pattern 160 may have an etch selectivity with respect to the lower seed layer 170. Second portions of the lower seed layer 170 may be respectively provided on bottom surfaces of the under bump patterns 150 and thus may not be removed by the etching process. The second portions of the lower seed layer 170, which remain after the etching process, may be formed into the under bump seed patterns 171. A third portion of the lower seed layer 170 may be disposed on a bottom surface of the dummy patterns 160 and thus may not be removed by the etching process. The third portion of the lower seed layer 170, which remains after the etching process, may be formed into the dummy seed pattern 172. The dummy seed pattern 172 may be spaced apart from the under bump seed patterns 171.

Referring to FIG. 2E, a first insulating layer 101 may be formed on the top surface of the release layer 910, top surfaces 150a of the under bump patterns 150, and top surfaces of the dummy patterns 160. The first insulating layer 101 may cover the top surfaces 150a and the sidewalls of the under bump patterns 150 and the top surfaces and the sidewalls of the dummy patterns 160. Since the dummy patterns 160 are provided, a top surface of the first insulating layer 101 may not have an undulation or may have a reduced undulation. For example, the top surface of the first insulating layer 101 on the top surfaces 150a of the under bump patterns 150 may be disposed at substantially the same level as the top surface of the first insulating layer 101 on the top surfaces of the dummy patterns 160. The first insulating layer 101 may be formed by a coating process such as a spin coating process or a slit coating process.

The first insulating layer 101 may be patterned to form first preliminary holes 109P in the first insulating layer 101. The patterning of the first insulating layer 101 may be performed by an exposure process and a development process. Each first preliminary hole 109P may expose the top surface 150a of one of the under bump patterns 150. The first preliminary holes 109P may not expose the dummy patterns 160. In other words, the first preliminary holes 109P may not be formed on the dummy patterns 160. A sidewall of the first preliminary hole 109P may be substantially perpendicular to the top surface 150a of the corresponding under bump pattern 150.

Referring to FIGS. 2F and 2G, a hardening process may be performed on the first insulating layer 101 to form a first hole 109. The hardening process of the first insulating layer 101 may be performed by a heat hardening process. During the hardening process, the first insulating layer 101 may be shrunk and a portion of the first insulating layer 101 may flow along an arrow, as illustrated in FIG. 2G. Thus, the first hole 109 may be formed from the first preliminary hole 109P. The first hole 109 may have a tapered shape. For example, a diameter of an upper portion of the first hole 109 may be greater than a diameter of a lower portion of the first hole 109. A width of the upper portion of the first hole 109 may be greater than a width of the lower portion of the first hole 109. Here, the lower portion of the first hole 109 may be adjacent to the under bump pattern 150. The first hole 109 may expose an inner sidewall 101c of the first insulating layer 101. The inner sidewall 101c of the first insulating layer 101 may correspond to a sidewall of the first hole 109. Since the first hole 109 has the tapered shape, an angle between the inner sidewall 101c of the first insulating layer 101 and the exposed top surface 150a of the under bump pattern 150 may be an obtuse angle. For example, the angle between the inner sidewall 101c of the first insulating layer 101 and the exposed top surface 150a of the under bump pattern 150 may range from 120 degrees to 135 degrees. The first hole 109 may be formed in plurality.

Figure 2H:
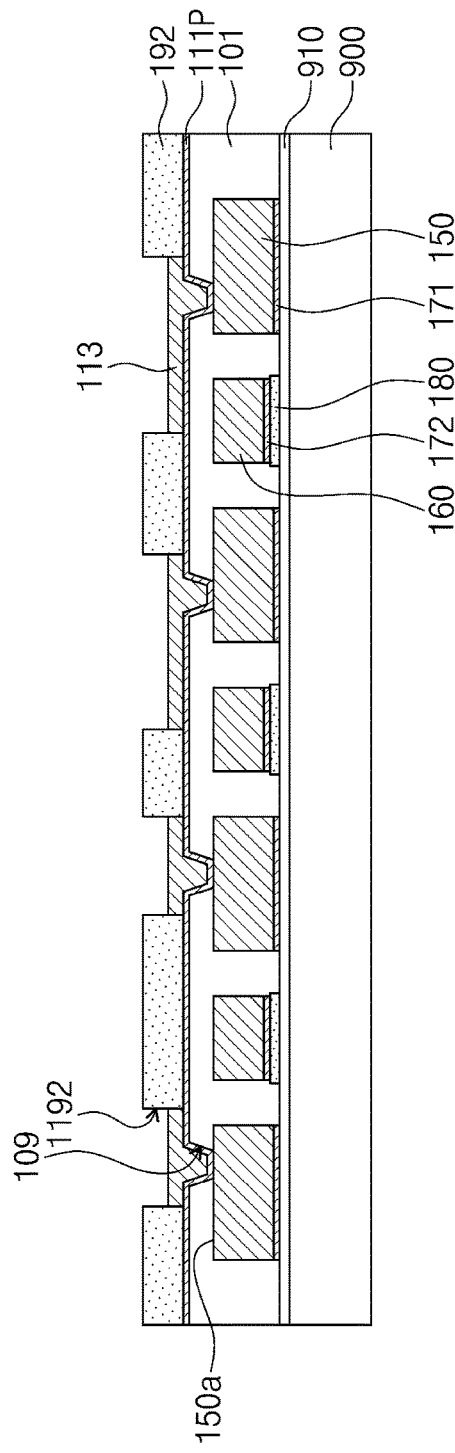

Referring to FIG. 2H, a first seed layer 111P, a second resist pattern 192, and first conductive layers 113 may be formed on the top surface of the first insulating layer 101. According to some example embodiments, the first seed layer 111P may be formed on the first insulating layer 101 and in the first holes 109. The first seed layer 111P may conformally cover the top surface of the first insulating layer 101, the inner sidewall of the first insulating layer 101, and the exposed top surface 150a of the under bump pattern 150.

The second resist pattern 192 may be formed on the first seed layer 111P. The formation of the second resist pattern 192 may include applying a photoresist material onto the first seed layer 111P. The second resist pattern 192 may be patterned to form first openings 1192. The patterning of the second resist pattern 192 may be performed by exposure and development processes. The first openings 1192 may vertically overlap with the first holes 109, respectively. Widths in a first horizontal direction of the first openings 1192 may be greater than widths in the first horizontal direction of the first holes 109 corresponding thereto. Alternatively, lengths in a second horizontal direction of the first openings 1192 may be greater than lengths in the second horizontal direction of the first holes 109 corresponding thereto. The first horizontal direction and the second horizontal direction may be substantially perpendicular to one another. A sidewall of each of the first openings 1192 may be substantially perpendicular to a bottom surface of each of the first openings 1192. Each of the first openings 1192 may expose the first seed layer 111P.

The first conductive layers 113 may be respectively formed in the first holes 109 to cover the first seed layer 111P. The first conductive layers 113 may fill lower portions of the first openings 1192, respectively. For example, the first conductive layers 113 may fill the first holes 109, respectively, but may not extend onto a top surface of the second resist pattern 192. The first conductive layers 113 may be formed by performing an electroplating process using the first seed layer 111P as an electrode. An additional planarization process may not be performed in the process of forming the first conductive layers 113.

Figure 2I:
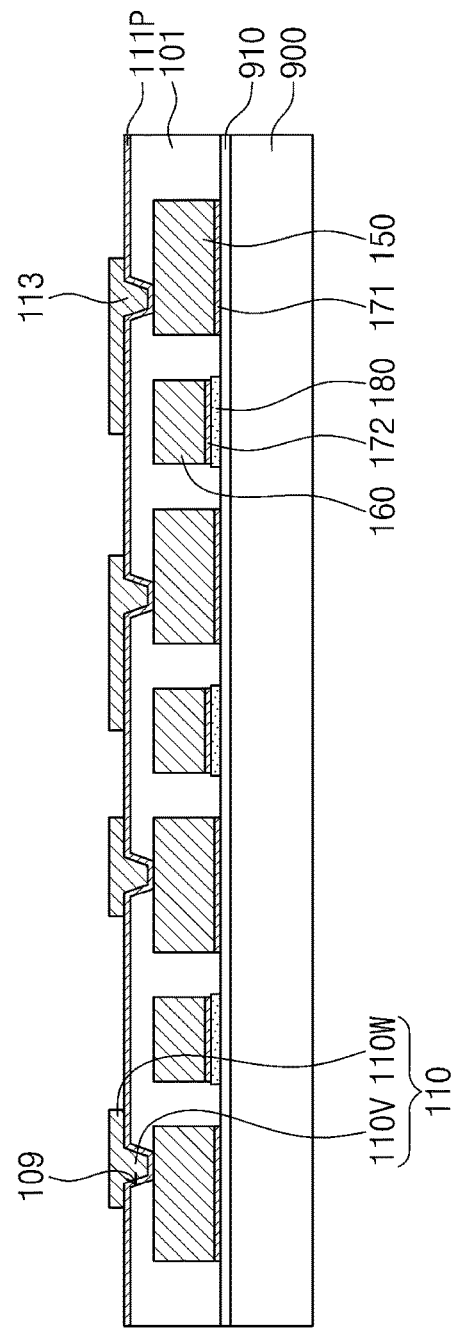

Referring to FIG. 2I, the second resist pattern 192 may be removed to expose a top surface of a first portion of the first seed layer 111P. The second resist pattern 192 may be removed by a strip process.

Referring to FIG. 2J, first seed patterns 111 may be formed by removing the exposed first portion of the first seed layer 111P. The removal of the first portion of the first seed layer 111P may be performed by an etching process. The etching process may be a wet etching process. In the etching process, the first conductive layers 113 may have an etch selectivity with respect to the first seed layer 111P. Second portions of the first seed layer 111P may be disposed on bottom surfaces of the first conductive layers 113 and thus may not be exposed to the etching process. The second portions of the first seed layer 111P, which remain after the etching process is finished, may be formed into the first seed patterns 111. Thus, first redistribution patterns 110 may be formed. The first redistribution patterns 110 may be laterally spaced apart from each other. Each of the first redistribution patterns 110 may include the first seed pattern 111 and the first conductive layer 113. The first conductive layers 113 may be disposed on the first seed patterns 111, respectively. Each of the first redistribution patterns 110 may include a first via portion 110V and a first interconnection portion 110W. The first via portion 110V may be provided in one of the first holes 109. Since the first via portion 110V is provided in the first hole 109, a first angle θ1 between a bottom surface and a sidewall of the first via portion 110V may be an obtuse angle. For example, the first angle θ1 may range from 120 degrees to 135 degrees. The first interconnection portion 110W may be provided on the top surface of the first insulating layer 101 and the first via portion 110V. The first via portion 110V and the first interconnection portion 110W may be the same as described above in the embodiments of FIGS. 1A and 1B, the embodiments of FIG. 1C, or the embodiments of FIG. 1D.

Referring to FIG. 2K, a second insulating layer 102 may be formed on the first insulating layer 101 to cover the first insulating layer 101 and the first redistribution patterns 110. For example, the second insulating layer 102 may cover top surfaces and sidewalls of the first redistribution patterns 110. Since the dummy pattern 160 is provided, a top surface of the second insulating layer 102 may have a reduced undulation or may not have an undulation. The second insulating layer 102 may be formed by a coating process.

The second insulating layer 102 may be patterned to form second preliminary holes (not shown) in the second insulating layer 102. The second preliminary holes may expose the top surfaces of the first redistribution patterns 110. For example, each of the second preliminary holes may expose the top surface of a corresponding one of the first interconnection portions 110W. Each of the second preliminary holes may have a sidewall substantially perpendicular to the top surface of the first interconnection portion 110W. Thereafter, a hardening process may be performed on the second insulating layer 102. During the hardening process, the second insulating layer 102 may be shrunk and portions of the second insulating layer 102 may flow toward the second preliminary holes. Second holes 108 may be formed after the hardening process. The second holes 108 may have tapered shapes. Thus, an angle between an inner sidewall of the second insulating layer 102 and the top surface of the first redistribution pattern 110 may be an obtuse angle. For example, the angle between the inner sidewall of the second insulating layer 102 and the top surface of the first redistribution pattern 110 may range from 120 degrees to 135 degrees.

Figure 2L:
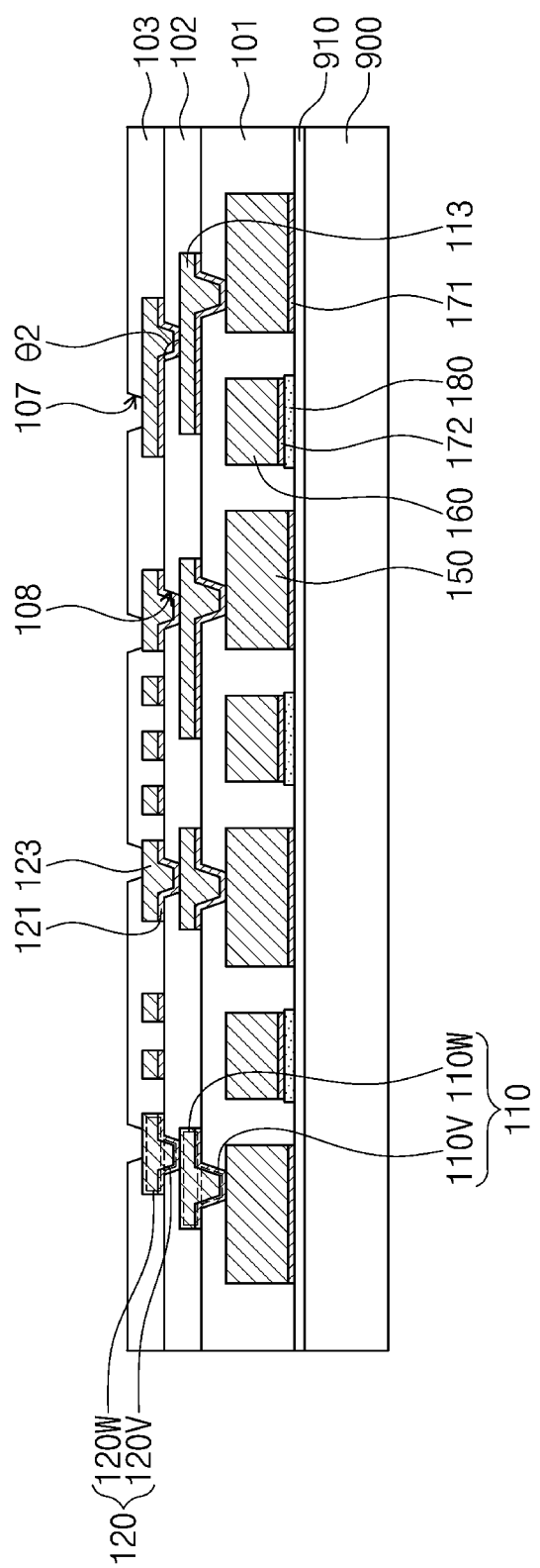

Referring to FIG. 2L, second redistribution patterns 120 may be formed in the second holes 108, respectively. The second redistribution patterns 120 may extend onto the top surface of the second insulating layer 102. The second redistribution patterns 120 may be laterally spaced apart from each other. The second redistribution patterns 120 may be formed by the same method as the formation of the first redistribution patterns 110. For example, the formation of the second redistribution patterns 120 may include forming a second seed layer, forming a third resist pattern having third openings on the second seed layer, forming second conductive layers 123 in the second holes 108 and the third openings, removing the third resist pattern to expose a portion of the second seed layer, and etching the exposed portion of the second seed layer to form second seed patterns 121. Each of the second redistribution patterns 120 may include the second seed pattern 121 and the second conductive layer 123. The second conductive layers 123 may be disposed on the second seed patterns 121, respectively. Each of the second redistribution patterns 120 may include a second via portion 120V and a second interconnection portion 120W. The second via portion 120V and the second interconnection portion 120W may be the same as described above in the embodiments of FIGS. 1A and 1B, the embodiments of FIG. 1C, or the embodiments of FIG. 1D. The second via portion 120V may be formed in one of the second holes 108, and thus a second angle θ2 between a bottom surface and a sidewall of the second via portion 120V may be an obtuse angle. For example, the second angle θ2 may range from 120 degrees to 135 degrees.

A third insulating layer 103 may be formed on the second insulating layer 102 to cover the second insulating layer 102 and the second redistribution patterns 120. Since the dummy pattern 160 is provided, a top surface of the third insulating layer 103 may have a reduced undulation or may not have an undulation. The third insulating layer 103 may be formed by a coating process. The third insulating layer 103 may be patterned to form third preliminary holes in the third insulating layer 103. Thereafter, a hardening process may be performed on the third insulating layer 103. The third insulating layer 103 may be shrunk during the hardening process, and thus third holes 107 may be formed. The third holes 107 may expose the top surfaces of the second redistribution patterns 120. Each of the third holes 107 may have a tapered shape. Thus, an angle between an inner sidewall of the third insulating layer 103 and the top surface of the second redistribution pattern 120 may be an obtuse angle.

Figure 2M:
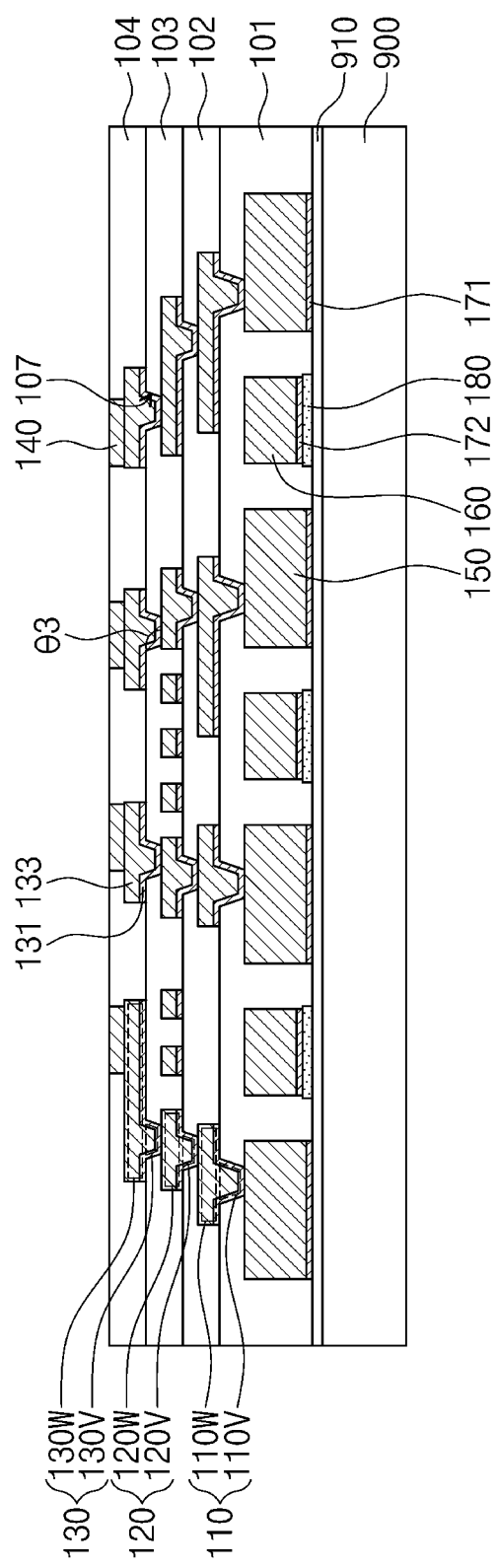

Referring to FIG. 2M, third redistribution patterns 130 may be formed in the third holes 107, respectively. The third redistribution patterns 130 may extend onto the top surface of the third insulating layer 103. The third redistribution patterns 130 may be laterally spaced apart from each other. The third redistribution patterns 130 may be formed by the same method as the formation of the first redistribution patterns 110. For example, the formation of the third redistribution patterns 130 may include forming a third seed layer, forming a fourth resist pattern having fourth openings on the third seed layer, forming third conductive layers 133 in the third holes 107 and the fourth openings, removing the fourth resist pattern to expose a portion of the third seed layer, and etching the exposed portion of the third seed layer to form third seed patterns 131. Each of the third redistribution patterns 130 may include the third seed pattern 131 and the third conductive layer 133. Each of the third redistribution patterns 130 may include a third via portion 130V and a third interconnection portion 130W. The third via portion 130V and the third interconnection portion 130W may be the same as described above in the embodiments of FIGS. 1A and 1B, the embodiments of FIG. 1C, or the embodiments of FIG. 1D. The third via portion 130V may be formed in a corresponding one of the third holes 107, and thus a third angle θ3 between a bottom surface and a sidewall of the third via portion 130V may be an obtuse angle. For example, the third angle θ3 may range from 120 degrees to 135 degrees.

Thereafter, a fourth insulating layer 104 may be formed on the third insulating layer 103 to cover the third insulating layer 103 and the third redistribution patterns 130. The fourth insulating layer 104 may be formed by substantially the same method as the formation of the first insulating layer 101. Bonding pads 140 may be formed on top surfaces of the third redistribution patterns 130.

Figure 2N:
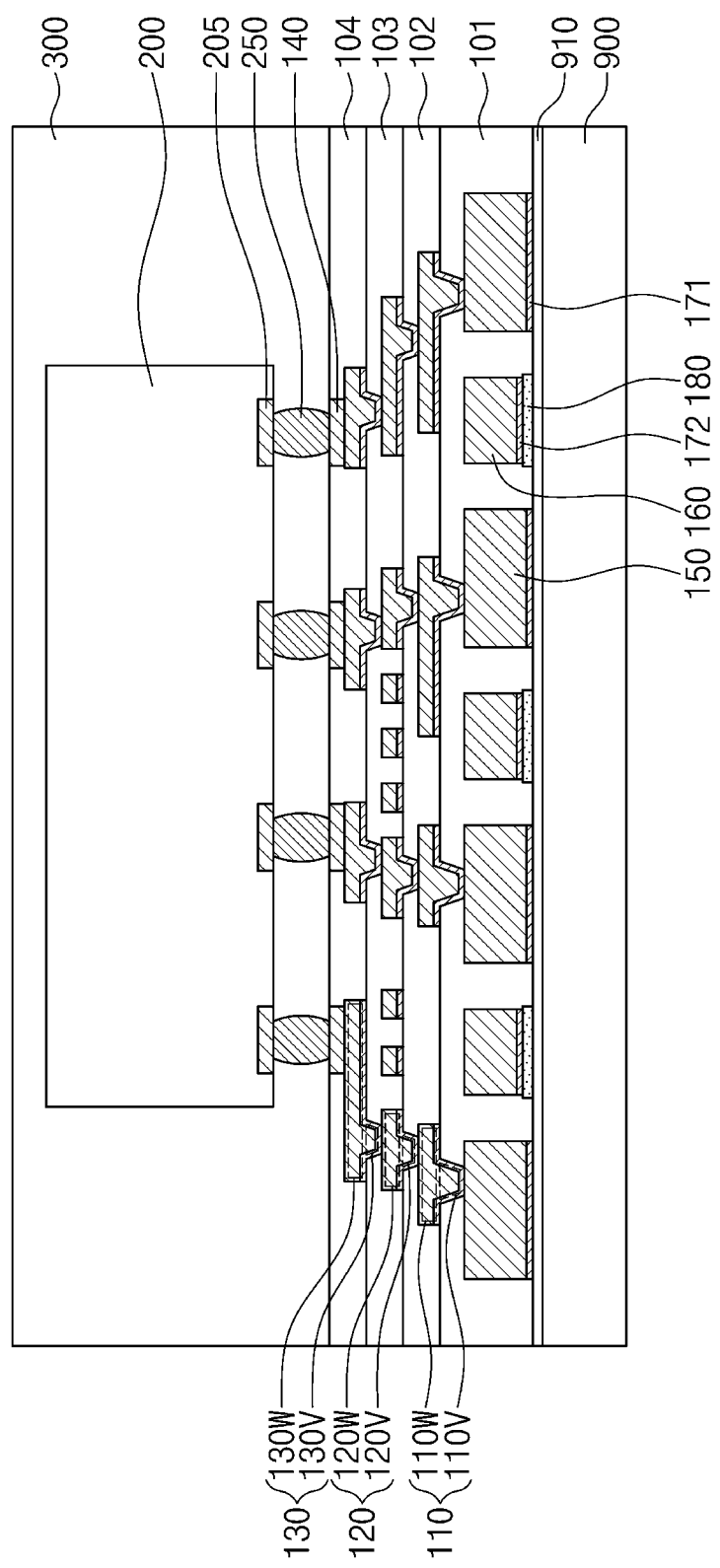
Figure 20:
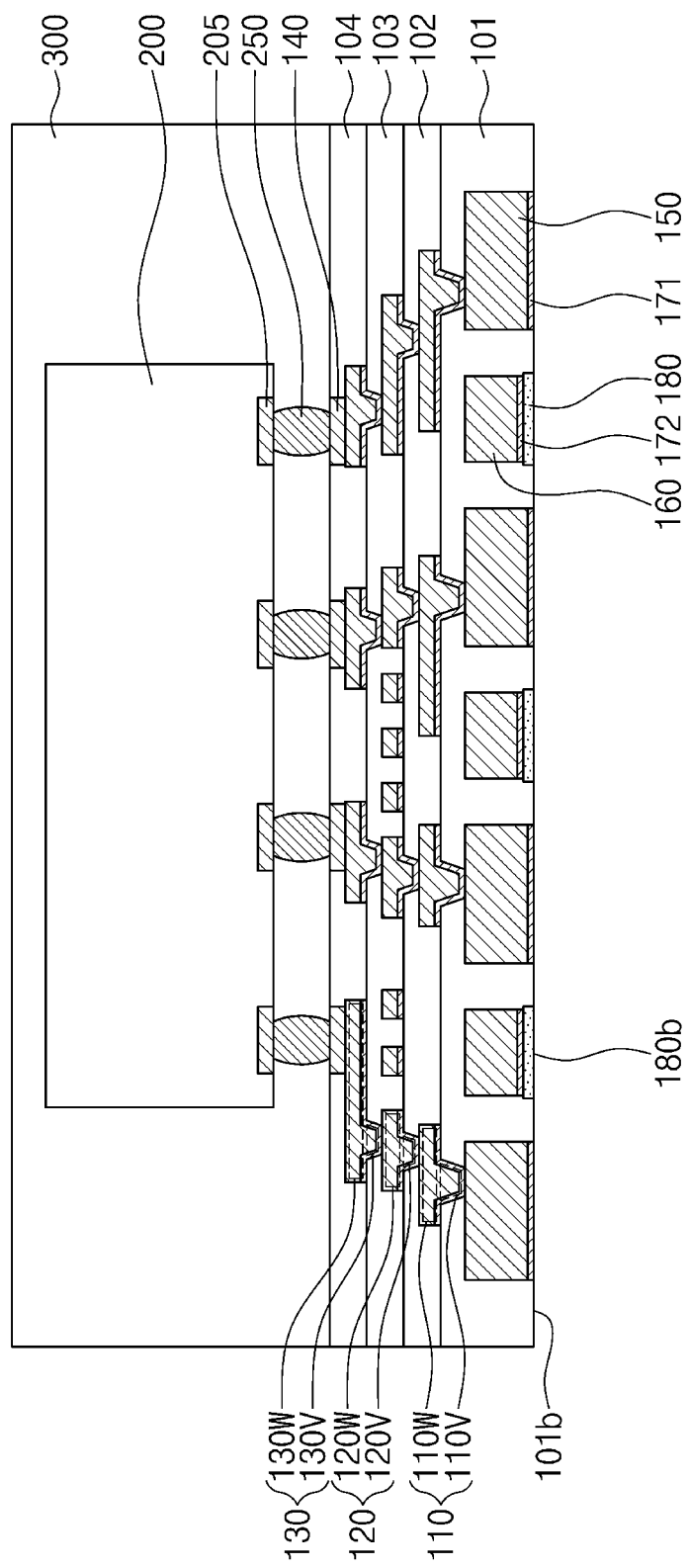

Referring to FIG. 2N, a semiconductor chip 200 having a plurality of chip pads 205 may be prepared. The semiconductor chip 200 may be disposed on the fourth insulating layer 104 in such a way that the chip pads 205 are aligned with the bonding pads 140, respectively. A plurality of bonding terminals 250 may be formed between the semiconductor chip 200 and the redistribution substrate 100. The bonding terminals 250 may be connected to the chip pads 205 and the bonding pads 140, respectively.

A molding layer 300 may be formed on the fourth insulating layer 104 to seal or cover the semiconductor chip 200. The molding layer 300 may further extend into a gap region between the fourth insulating layer 104 and the semiconductor chip 200 to seal or cover the bonding terminals 250.

Referring to FIG. 2O, the release layer 910 and the carrier substrate 900 may be removed from the first insulating layer 101 to expose a bottom surface 101b of the first insulating layer 101, bottom surfaces 180b of the passivation patterns 180, and bottom surfaces of the under bump seed patterns 171.

Figure 2P:
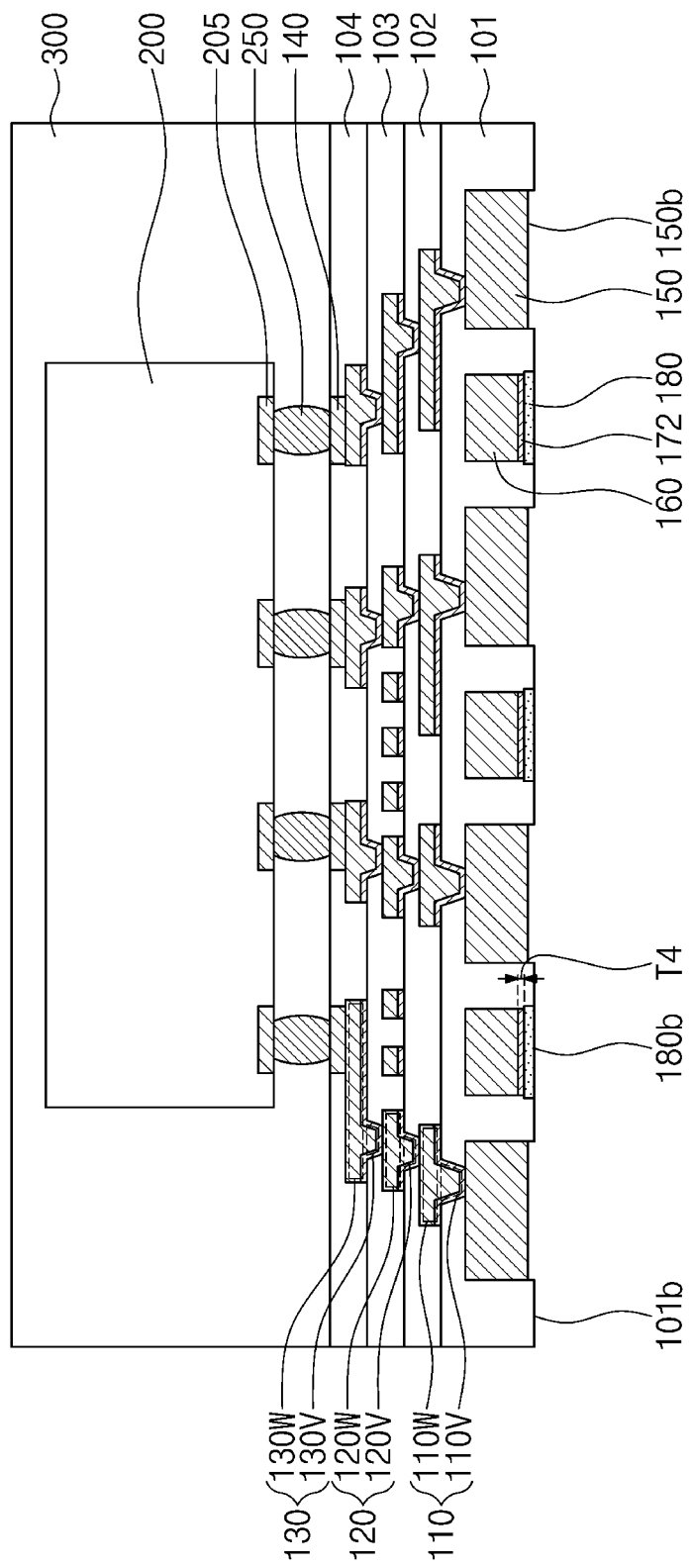

Referring to FIG. 2P, the under bump seed patterns 171 may be removed to expose bottom surfaces 150b of the under bump patterns 150. The removal of the under bump seed patterns 171 may be performed by an etching process. The etching process may be a wet etching process. In the etching process, the under bump patterns 150, the first insulating layer 101, and the passivation patterns 180 may have an etch selectivity with respect to the under bump seed patterns 171. Thus, the under bump patterns 150, the first insulating layer 101, and the passivation patterns 180 may remain after the etching process is finished. Due to the passivation patterns 180, the dummy seed patterns 172 may not be exposed to the etching process. Thus, the dummy seed pattern 172 may not be removed.

Since the under bump seed patterns 171 are removed, the exposed bottom surfaces 150b of the under bump patterns 150 may be disposed at a higher level than the bottom surface 180b of the passivation pattern 180 and the bottom surface 101b of the first insulating layer 101. As described with reference to FIGS. 2C and 2D, the under bump seed patterns 171 and the dummy seed pattern 172 may be formed by patterning the lower seed layer 170. Thus, thicknesses of the under bump seed patterns 171 may be substantially equal to a thickness T4 of the dummy seed pattern 172. A level difference between the bottom surface 150b of the under bump pattern 150 and the bottom surface 101b of the first insulating layer 101 may be substantially equal to the thickness T4 of the dummy seed pattern 172.

Referring again to FIGS. 1A and 1B, conductive terminals 400 may be formed on the exposed bottom surfaces 150b of the under bump patterns 150, respectively. The formation of the conductive terminals 400 may include performing a process of attaching a solder ball.

Bonding strength between the conductive terminals 400 and the under bump seed patterns 171 (see FIG. 2O) may be relatively weak. For example, the bonding strength between the conductive terminals 400 and the under bump seed patterns 171 may be weaker than bonding strength between the conductive terminals 400 and the under bump patterns 150. According to the embodiments of the inventive concepts, the conductive terminals 400 may be formed on the under bump patterns 150 after the removal of the under bump seed patterns 171, and thus the conductive terminals 400 may be firmly bonded to the under bump patterns 150. The conductive terminals 400 may be in direct contact with the under bump patterns 150. The semiconductor package 10 may be manufactured by the manufacturing method according to the aforementioned embodiments of the inventive concepts.

In the above embodiments, a single semiconductor package 10 was described and illustrated for the purpose of ease and convenience in explanation. However, embodiments of the inventive concepts are not limited to the manufacture of the semiconductor package in a chip level. For example, the semiconductor package 10 may be manufactured in a chip level, a panel level, or a wafer level.

Figure 3:
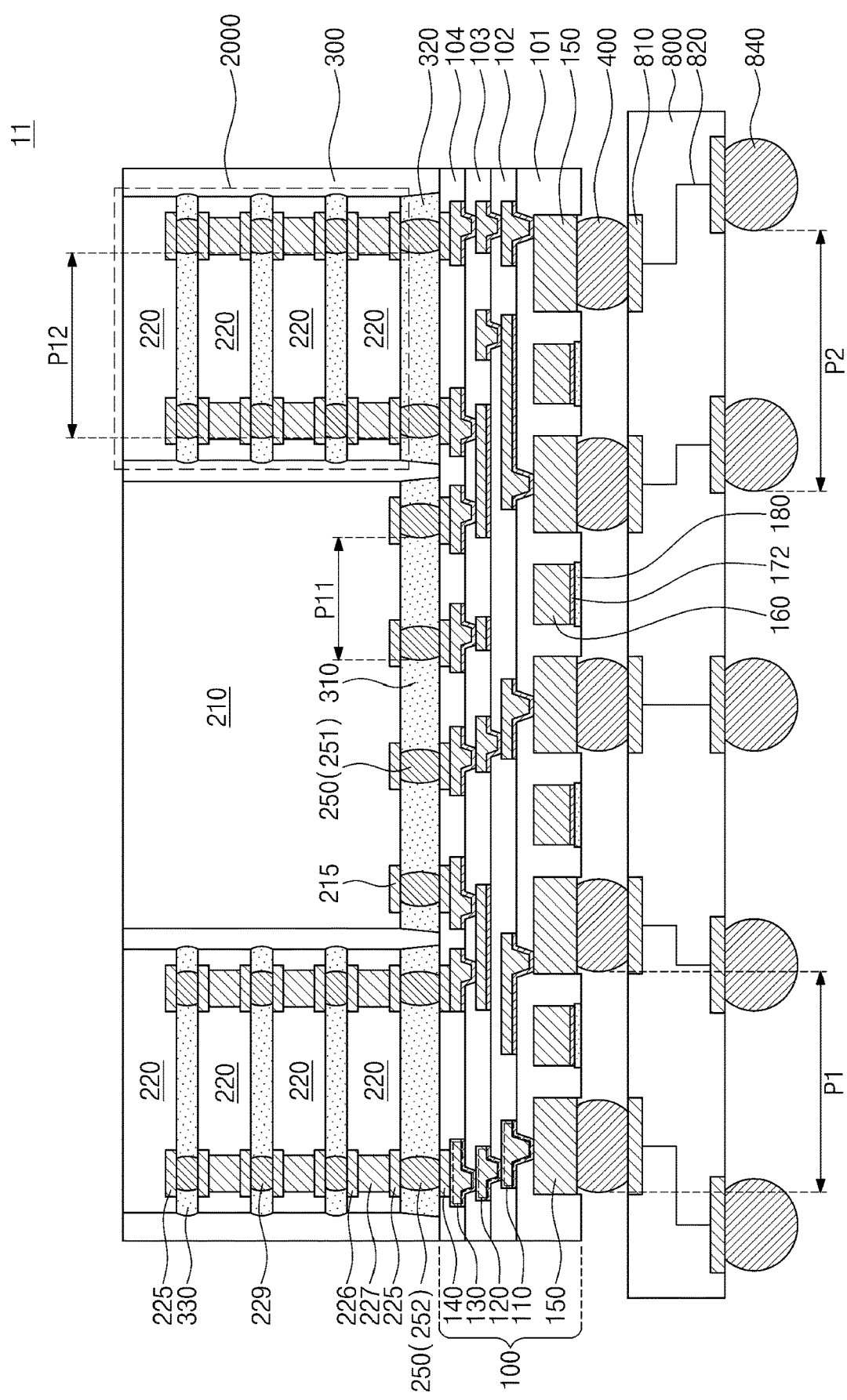
FIG. 3 is a cross-sectional view illustrating a semiconductor package according to example embodiments of the inventive concepts.

FIG. 3 is a cross-sectional view illustrating a semiconductor package, according to example embodiments of the inventive concepts. Hereinafter, the descriptions to the same features as in the above embodiments will be omitted for the purpose of ease and convenience in explanation.

Referring to FIG. 3, a semiconductor package 11 may include a package substrate 800, a redistribution substrate 100, a conductive terminal 400, a first semiconductor chip 210, a chip stack 2000, and a molding layer 300. The conductive terminal 400 and the molding layer 300 may be substantially the same as described with reference to FIGS. 1A and 1B. The conductive terminal 400 may be a plurality of conductive terminals 400, and each conductive terminal 400 may be electrically connected to a corresponding one of the under bump patterns 150. Bonding terminals 250 may include a first bonding terminal 251 and a second bonding terminal 252. In example embodiments, the first bonding terminal 251 and the second bonding terminal 252 may be a plurality of first bonding terminals 251 and a plurality of second bonding terminals 252, respectively.

The package substrate 800 may include a printed circuit board (PCB). The package substrate 800 may include metal interconnection lines 820 and metal pads 810. The metal interconnection lines 820 may be provided in the package substrate 800. In the present specification, it may be understood that when a component is referred to as being connected to the package substrate 800, it may be connected to the metal interconnection line 820. The metal pads 810 may be provided on a top surface of the package substrate 800 and may be electrically connected to the metal interconnection lines 820. External connection terminals 840 may be provided on a bottom surface of the package substrate 800 and may be connected to the metal interconnection lines 820, respectively. External electrical signals may be transmitted to the metal interconnection lines 820 through the external connection terminals 840. Solder balls may be used as the external connection terminals 840. The external connection terminals 840 may include a metal such as a solder material.

The redistribution substrate 100 may be disposed on the package substrate 800. The redistribution substrate 100 may function as an interposer substrate. The conductive terminal 400 may be aligned with the metal pad 810 of the package substrate 800 and may be connected to the metal pad 810. The redistribution substrate 100 may be electrically connected to the package substrate 800 through the conductive terminal 400. The redistribution substrate 100 may be substantially the same as described with reference to FIGS. 1A and 1B. Alternatively, the redistribution substrate 100 may be substantially the same as described in the embodiments of FIG. 1C or the embodiments of FIG. 1D.

The first semiconductor chip 210 may be mounted on a top surface of the redistribution substrate 100. For example, the first bonding terminal 251 may be provided between a chip pad 215 of the first semiconductor chip 210 and the bonding pad 140. The first semiconductor chip 210 may be substantially the same as the semiconductor chip 200 of FIGS. 1A and 1B, and a position relationship, a function and a material of the first bonding terminal 251 may be substantially the same as those of the bonding terminal 250 of FIGS. 1A and 1B. The first bonding terminal 251 may be provided in plurality. A pitch P11 of the plurality of first bonding terminals 251 may be less than a pitch P1 of a plurality of the conductive terminals 400. The pitch P11 of the plurality of first bonding terminals 251 may be less than a pitch P2 of the external connection terminals 840.

The chip stack 2000 may be mounted on the top surface of the redistribution substrate 100. The chip stack 2000 may be laterally spaced apart from the first semiconductor chip 210. The chip stack 2000 may include a plurality of second semiconductor chips 220 sequentially stacked. Each of the second semiconductor chips 220 may be the same or similar as the semiconductor chip 200 of FIGS. 1A and 1B. In some embodiments, a kind of the second semiconductor chips 220 may be different from a kind of the first semiconductor chip 210. For example, the first semiconductor chip 210 may be one of a logic chip, a buffer chip, and a system-on-chip (SOC), and the second semiconductor chip 220 may be one of a logic chip, a memory chip, a buffer chip, and a system-on-chip (SOC). Here, the second semiconductor chip 220 may be different from the first semiconductor chip 210. In the present specification, the memory chip may include a high bandwidth memory (HBM) chip. For an example, the first semiconductor chip 210 may be the logic chip, and the second semiconductor chips 220 may be the HBM chips. For another example, a lowermost one of the second semiconductor chips 220 may be the logic chip, and the others of the second semiconductor chips 220 may be the HBM chips.

Each of the second semiconductor chips 220 may include a lower pad 225, a through-electrode 227, and an upper pad 226. The lower pad 225 and the upper pad 226 may be provided on a bottom surface and a top surface of each of the second semiconductor chips 220, respectively. At least one of the lower pad 225 or the upper pad 226 may be electrically connected to integrated circuits of the second semiconductor chip 220. The through-electrode 227 may be disposed in the second semiconductor chip 220 and may be connected to the lower pad 225 and the upper pad 226. An uppermost one of the second semiconductor chips 220 may include the lower pad 225 but may not include the through-electrode 227 and the upper pad 226. Unlike FIG. 3, the uppermost second semiconductor chip 220 may further include the through-electrode 227 and the upper pad 226. An interposer terminal 229 may be disposed between two second semiconductor chips 220 adjacent to each other and may be connected to the lower pad 225 and the upper pad 226 of the respective two second semiconductor chips 220. Thus, the plurality of second semiconductor chips 220 may be electrically connected to each other. The interposer terminal 229 may include a solder ball, a pillar, or a bump. The interposer terminal 229 may include, but not be limited to, a solder material. In some embodiments, the interposer terminal 229 may be a plurality of interposer terminals 229, the lower pad 225 may be a plurality of lower pads 225, and the upper pad 226 may be a plurality of upper pads 226.

In certain embodiments, the interposer terminal 229 may be omitted. In this case, the lower pad 225 and the upper pad 226, facing each other, of the adjacent second semiconductor chips 220 may be bonded directly to each other.

The second bonding terminal 252 may be disposed between the lowermost second semiconductor chip 220 and the redistribution substrate 100 and may be connected to the lower pad 225 and a corresponding bonding pad 140. Thus, the second semiconductor chips 220 may be electrically connected to the first semiconductor chip 210 and the conductive terminal 400 through the redistribution substrate 100. A position relationship, a function, and a material of the second bonding terminal 252 may be substantially the same as those of the bonding terminal 250 of FIGS. 1A and 1B. A pitch P12 of a plurality of the second bonding terminals 252 may be less than the pitch P1 of the conductive terminals 400 and the pitch P2 of the external connection terminals 840.

The chip stack 2000 may be provided in plurality. The plurality of chip stacks 2000 may be laterally spaced apart from each other. The first semiconductor chip 210 may be disposed between the chip stacks 2000. Thus, lengths of electrical paths between the first semiconductor chip 210 and the chip stacks 2000 may be reduced.

A first underfill pattern 310 may be provided in a first gap region between the redistribution substrate 100 and the first semiconductor chip 210 to seal or cover the first bonding terminal 251. The first underfill pattern 310 may include an insulating polymer such as an epoxy-based polymer. Second underfill patterns 320 may be respectively provided in second gap regions between the redistribution substrate 100 and the chip stacks 2000 to seal or cover the second bonding terminals 252. The second underfill patterns 320 may include an insulating polymer such as an epoxy-based polymer. Unlike FIG. 3, a single underfill pattern may be provided in the first gap region and the second gap regions to seal or cover the first bonding terminal 251 and the second bonding terminals 252.

A third underfill pattern 330 may be provided between the second semiconductor chips 220 to seal or cover the interposer terminals 229. The third underfill pattern 330 may include an insulating polymer such as an epoxy-based polymer.

The molding layer 300 may be disposed on the redistribution substrate 100 to cover a sidewall of the first semiconductor chip 210 and sidewalls of the second semiconductor chips 220. For example, the molding layer 300 may fill a space between the first semiconductor chip 210 and the second semiconductor chips 220. The molding layer 300 may expose a top surface of the first semiconductor chip 210 and a top surface of the uppermost second semiconductor chip 220. In some embodiments, top surfaces of the molding layer 300, the first semiconductor chip 210, and the uppermost second semiconductor chip 220 may be coplanar. Unlike FIG. 3, the molding layer 300 may cover the top surface of the first semiconductor chip 210 and the top surface of the uppermost second semiconductor chip 220. In certain embodiments, the first and second underfill patterns 310 and 320 may be omitted, and the molding layer 300 may extend into the first gap region and the second gap regions.

Even though not shown in the drawings, a conductive plate may be disposed on the top surface of the first semiconductor chip 210, the top surface of the chip stack 2000, and a top surface of the molding layer 300. The conductive plate may extend onto a sidewall of the molding layer 300. The conductive plate may protect the first semiconductor chip 210 and the chip stack 2000 from the outside. For example, the conductive plate may prevent injection of impurities and/or may absorb a physical impact. The conductive plate may include a material having high thermal conductivity to function as a heat sink or a heat slug. For example, when the semiconductor package is operated, heat generated from the redistribution substrate 100, the first semiconductor chip 210, and/or the second semiconductor chips 220 may be rapidly released through the conductive plate. The conductive plate may have electrical conductivity to function as an electromagnetic shielding layer. For example, the conductive plate may shield electromagnetic interference (EMI) of the first semiconductor chip 210 and the second semiconductor chips 220. The conductive plate may be grounded through the redistribution substrate 100 to prevent the first semiconductor chip 210 and/or the second semiconductor chips 220 from being electrically damaged by electrostatic discharge (ESD).

Even though not shown in the drawings, a third semiconductor chip may further be mounted on the redistribution substrate 100. A kind of the third semiconductor chip may be different from those of the first and second semiconductor chips 210 and 220.

Figure 4:
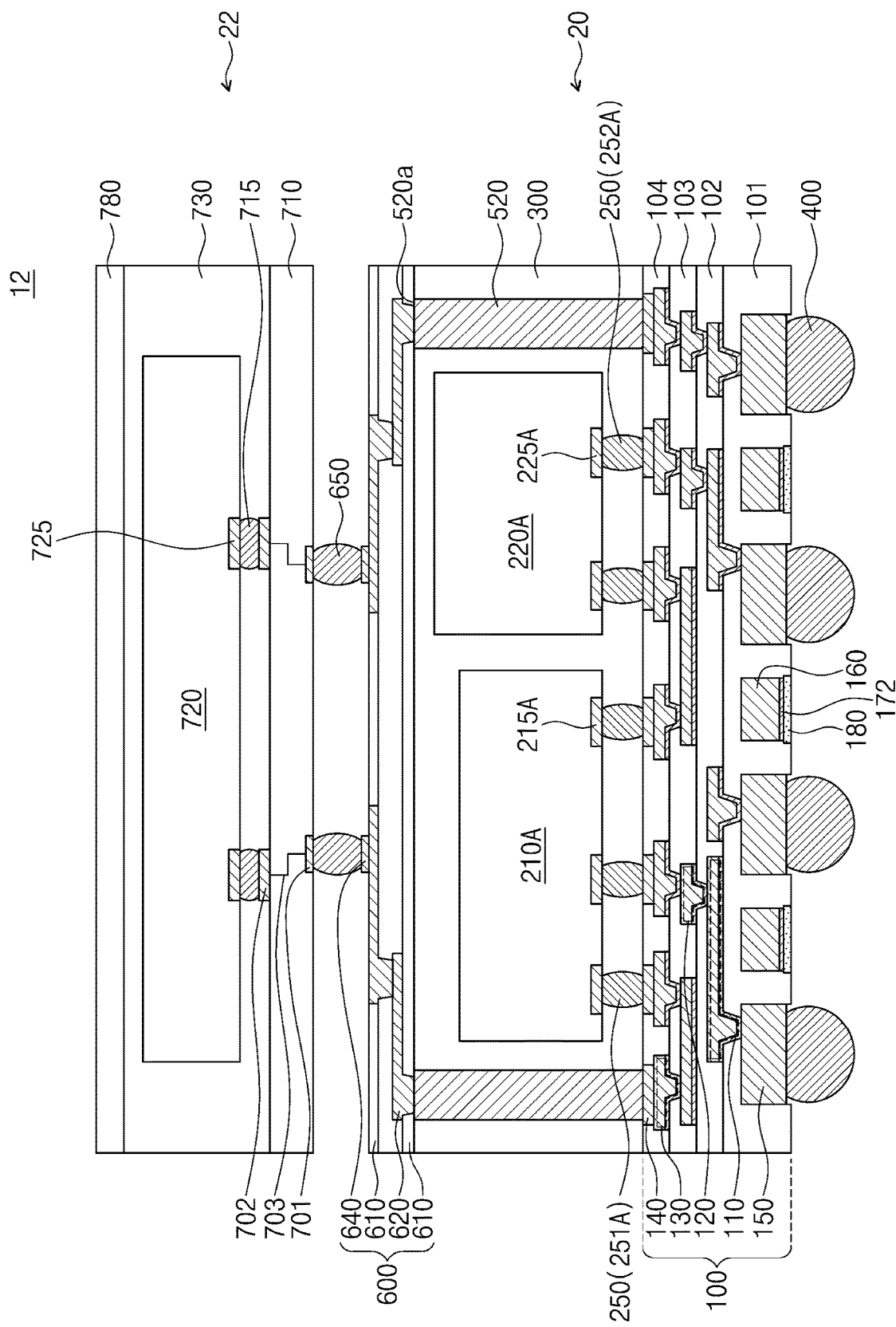
FIG. 4 is a cross-sectional view illustrating a semiconductor package, according to example embodiments of the inventive concepts.

FIG. 4 is a cross-sectional view illustrating a semiconductor package, according to example embodiments of the inventive concepts. Hereinafter, the descriptions to the same features as in the above embodiments will be omitted for the purpose of ease and convenience in explanation.

Referring to FIG. 4, a semiconductor package 12 may include a lower semiconductor package 20 and an upper semiconductor package 22. The lower semiconductor package 20 may include a redistribution substrate 100, conductive terminals 400, bonding terminals 250, a first semiconductor chip 210A, a second semiconductor chip 220A, a molding layer 300, and conductive structures 520. The redistribution substrate 100, the conductive terminals 400, and the molding layer 300 may be substantially the same as described with reference to FIGS. 1A and 1B. Alternatively, the redistribution substrate 100 may be substantially the same as described in the embodiments of FIG. 1C or the embodiments of FIG. 1D.

The second semiconductor chip 220A may be laterally spaced apart from the first semiconductor chip 210A. A kind of the second semiconductor chip 220A may be different from a kind of the first semiconductor chip 210A. For example, the first semiconductor chip 210A may include one of a logic chip, a memory chip, and a power management chip, and the second semiconductor chip 220A may include another of the logic chip, the memory chip, and the power management chip. The logic chip may include an ASIC chip or an application processor (AP) chip. The ASIC chip may include an application specific integrated circuit (ASIC). The power management chip may include a power management integrated circuit (PMIC). For example, the first semiconductor chip 210A may be the ASIC chip, and the second semiconductor chip 220A may be the power management chip. Each of the first and second semiconductor chips 210A and 220A may be similar to the semiconductor chip 200 described with reference to FIGS. 1A and 1B. Unlike FIG. 4, the second semiconductor chip 220A may be omitted. In certain embodiments, a third semiconductor chip may further be mounted on the top surface of the redistribution substrate 100.

The bonding terminals 250 may include first bonding terminals 251A and second bonding terminals 252A. Each of the first bonding terminals 251A may be similar to the first bonding terminal 251 described with reference to FIG. 3, and each of the second bonding terminals 252A may be similar to the second bonding terminal 252 described with reference to FIG. 3. Chip pads 215A of the first semiconductor chip 210A may be electrically connected to the redistribution substrate 100 through the first bonding terminals 251A. Chip pads 225A of the second semiconductor chip 220A may be electrically connected to the redistribution substrate 100 through the second bonding terminals 252A. Thus, the second semiconductor chip 220A may be electrically connected to the first semiconductor chip 210A through the redistribution substrate 100.

The conductive structures 520 may be disposed on the top surface of the redistribution substrate 100 and each conductive structure 520 may be connected to a corresponding bonding pad 140. The conductive structures 520 may be laterally spaced apart from the first and second semiconductor chips 210A and 220A. The conductive structures 520 may be provided on an edge region of the redistribution substrate 100 when viewed in a plan view. A metal pillar may be provided on the redistribution substrate 100 to form each conductive structure 520. In other words, the conductive structure 520 may be the metal pillar. The conductive structures 520 may be electrically connected to the redistribution substrate 100. For example, the conductive structures 520 may be electrically connected to the first semiconductor chip 210A, the second semiconductor chip 220A, and/or the conductive terminals 400 through the redistribution substrate 100. The conductive structures 520 may include a metal such as copper.

The molding layer 300 may be disposed on the top surface of the redistribution substrate 100 to cover the first and second semiconductor chips 210A and 220A. The molding layer 300 may surround sidewalls of the conductive structures 520. The molding layer 300 may be provided between the first and second semiconductor chips 210A and 220A, between the first semiconductor chip 210A and the conductive structures 520, and between the second semiconductor chip 220A and the conductive structures 520. The molding layer 300 may expose top surfaces 520a of the conductive structures 520.

The lower semiconductor package 20 may further include an upper redistribution layer 600. The upper redistribution layer 600 may be provided on a top surface of the molding layer 300. The upper redistribution layer 600 may include upper insulating patterns 610, upper redistribution patterns 620, and upper bonding pads 640. The upper insulating patterns 610 may be stacked on the molding layer 300. The upper insulating patterns 610 may include a photosensitive polymer. Each of the upper redistribution patterns 620 may include a via portion in the upper insulating pattern 610 and an interconnection portion between the upper insulating patterns 610. The upper redistribution patterns 620 may include a metal such as copper. At least one of the upper redistribution patterns 620 may be in contact with the top surface 520a of the conductive structure 520. Thus, the upper redistribution patterns 620 may be electrically connected to the conductive structure 520. The upper bonding pads 640 may be disposed on an uppermost one of the upper insulating patterns 610 and may be connected to the upper redistribution patterns 620. The upper bonding pads 640 may be electrically connected to the conductive terminals 400, the first semiconductor chip 210A, and/or the second semiconductor chip 220A through the upper redistribution patterns 620 and the conductive structures 520. Since the upper redistribution patterns 620 are provided, the upper bonding pads 640 may not be vertically aligned with the conductive structures 520.

The upper semiconductor package 22 may be disposed on the lower semiconductor package 20. For example, the upper semiconductor package 22 may be disposed on the upper redistribution layer 600. The upper semiconductor package 22 may include an upper substrate 710, an upper semiconductor chip 720, and an upper molding layer 730. The upper substrate 710 may be a printed circuit board (PCB). Alternatively, the upper substrate 710 may be a redistribution layer. For example, the upper substrate 710 may be formed by substantially the same method as the formation of the redistribution substrate 100 described with reference to FIGS. 2A to 2P. First connection pads 701 and second connection pads 702 may be disposed on a bottom surface and a top surface of the upper substrate 710, respectively. Interconnection lines 703 may be provided in the upper substrate 710 and each interconnection line 703 may be connected to a corresponding first connection pad 701 and a corresponding second connection pad 702. The interconnection line 703 is schematically illustrated in FIG. 4. However, a shape and arrangement of the interconnection line 703 may be variously modified. The first connection pads 701, the second connection pads 702, and the interconnection lines 703 may include a conductive material such as a metal.

The upper semiconductor chip 720 may be disposed on the upper substrate 710. The upper semiconductor chip 720 may include integrated circuits (not shown), and the integrated circuits may include a memory circuit, a logic circuit, or a combination thereof. A kind of the upper semiconductor chip 720 may be different from those of the first and second semiconductor chips 210A and 220A. For example, the upper semiconductor chip 720 may be a memory chip. Bump terminals 715 may be disposed between the upper substrate 710 and the upper semiconductor chip 720, and each bump terminal 715 may be connected to a corresponding second connection pad 702 and a corresponding chip pad 725 of the upper semiconductor chip 720. The upper semiconductor chip 720 may be electrically connected to the first connection pads 701 through the bump terminals 715 and the interconnection lines 703. Unlike FIG. 4, the bump terminals 715 may be omitted, and the chip pads 725 may be connected directly to the second connection pads 702.

The upper molding layer 730 may be provided on the upper substrate 710 to cover the upper semiconductor chip 720. The upper molding layer 730 may include an insulating polymer such as an epoxy-based polymer.

The upper semiconductor package 22 may further include a heat dissipation structure 780. The heat dissipation structure 780 may include a heat sink, a heat slug, or a thermal interface material (TIM) layer. The heat dissipation structure 780 may include, for example, a metal. The heat dissipation structure 780 may be disposed on a top surface of the upper molding layer 730. In addition, the heat dissipation structure 780 may extend onto a sidewall of the upper molding layer 730 or a sidewall of the molding layer 300.

The semiconductor package 12 may further include connection terminals 650. Each connection terminal 650 may be disposed between corresponding ones of the upper bonding pad 640 and the first connection pad 701 and may be connected to the upper bonding pad 640 and the first connection pad 701. Thus, the upper semiconductor package 22 may be electrically connected to the first semiconductor chip 210A, the second semiconductor chip 220A, and/or the conductive terminal 400 through the connection terminal 650. It may be understood that when a component is referred to as being electrically connected to the upper semiconductor package 22, it may be electrically connected to the integrated circuits in the upper semiconductor chip 720.

In certain embodiments, the upper substrate 710 may be omitted, and the connection terminals 650 may be connected directly to the chip pads 725 of the upper semiconductor chip 720. In this case, the upper molding layer 730 may be in direct contact with a top surface of the upper redistribution layer 600. In certain embodiments, the upper substrate 710 and the connection terminal 650 may be omitted, and the chip pads 725 of the upper semiconductor chip 720 may be connected directly to the upper bonding pads 640.

Figure 5A:
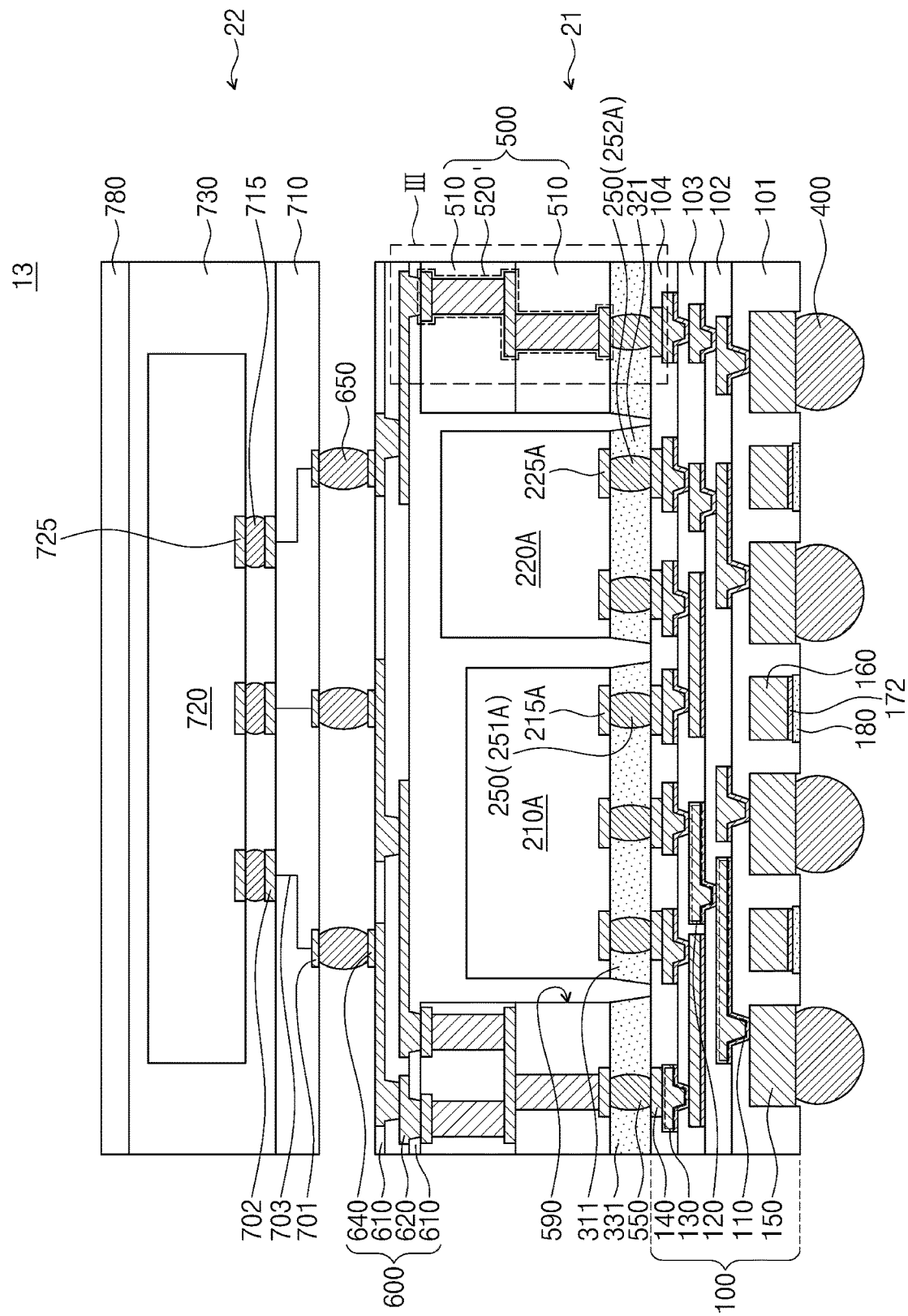
FIG. 5A is a cross-sectional view illustrating a semiconductor package, according to example embodiments of the inventive concepts.
Figure 5B:
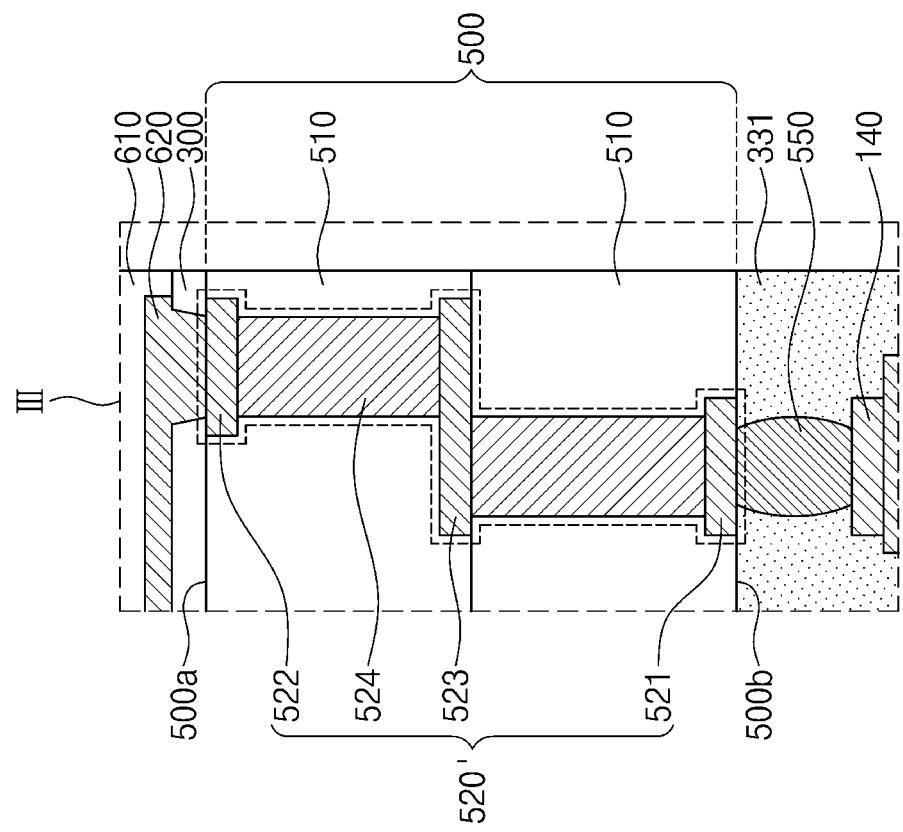
FIG. 5B is an enlarged view of a region 'III' of FIG. 5A.

FIG. 5A is a cross-sectional view illustrating a semiconductor package, according to example embodiments of the inventive concepts. FIG. 5B is an enlarged view of a region 'III' of FIG. 5A. Hereinafter, the descriptions to the same features as in the above embodiments will be omitted for the purpose of ease and convenience in explanation.

Referring to FIGS. 5A and 5B, a semiconductor package 13 may include a lower semiconductor package 21 and an upper semiconductor package 22. The lower semiconductor package 21 may include a redistribution substrate 100, conductive terminals 400, bonding terminals 250, a first semiconductor chip 210A, a second semiconductor chip 220A, a molding layer 300, and a connection substrate 500. The redistribution substrate 100, the conductive terminals 400, the bonding terminals 250, and the molding layer 300 may be substantially the same as described with reference to FIGS. 1A and 1B. Alternatively, the redistribution substrate 100 may be substantially the same as described in the embodiments of FIG. 1C or the embodiments of FIG. 1D. The first semiconductor chip 210A and the second semiconductor chip 220A may be substantially the same as the first semiconductor chip 210A and the second semiconductor chip 220A of FIG. 4, respectively. The bonding terminals 250 may include first bonding terminals 251A and second bonding terminals 252A. The first bonding terminals 251A and the second bonding terminals 252A may be substantially the same as the first bonding terminals 251A and the second bonding terminals 252A of FIG. 4, respectively. A first underfill layer 311 may be provided in a first gap region between the redistribution substrate 100 and the first semiconductor chip 210A. The first underfill layer 311 may surround or seal the first bonding terminals 251A. A second underfill layer 321 may be provided in a second gap region between the redistribution substrate 100 and the second semiconductor chip 220A to surround or seal the second bonding terminals 252A.

The connection substrate 500 may be disposed on the redistribution substrate 100. The connection substrate 500 may have a substrate hole 590 penetrating the connection substrate 500. For example, the connection substrate 500 may be manufactured by forming the substrate hole 590 penetrating a top surface and a bottom surface of a printed circuit board. The substrate hole 590 may be formed in a central portion of the connection substrate 500 when viewed in a plan view. Like FIG. 5A, the first and second semiconductor chips 210A and 220A may be disposed in the substrate hole 590 of the connection substrate 500. The first and second semiconductor chips 210A and 220A may be spaced apart from an inner sidewall of the connection substrate 500.

The connection substrate 500 may include a base layer 510 and one or more conductive structures 520'. The base layer 510 may include a plurality of stacked base layers 510. The base layers 510 may include an insulating material. For example, the base layers 510 may include a carbon-based material, a ceramic, or a polymer. The substrate hole 590 may penetrate the base layers 510. The one or more conductive structures 520' may be provided in the base layers 510. As illustrated in FIG. 5B, each conductive structure 520' may include one or more first pads 521, a conductive interconnection line 523, vias 524, and one or more second pads 522. Each first pad 521 may be exposed at a bottom surface 500b of the connection substrate 500. The conductive interconnection line 523 may be disposed between the base layers 510. The vias 524 may penetrate the base layers 510 and may be connected to the conductive interconnection line 523. Each second pad 522 may be exposed at a top surface 500a of the connection substrate 500 and may be connected to one of the vias 524. The one or more second pads 522 may be electrically connected to the one or more first pads 521 through the vias 524 and the conductive interconnection line 523. The one or more second pads 522 may not be vertically aligned with the one or more first pads 521. The number of the second pads 522 may be different from the number of the first pads 521. The conductive structure 520' may include a metal. For example, the conductive structure 520' may include at least one of copper, aluminum, tungsten, titanium, tantalum, iron, or any alloy thereof.

Connection bumps 550 may be disposed between the redistribution substrate 100 and the connection substrate 500. Each connection bump 550 may be disposed between a first pad 521 and a corresponding bonding pad 140 and may be connected to the first pad 521 and the corresponding bonding pad 140. The conductive structure 520' may be electrically connected to the redistribution substrate 100 through the connection bumps 550. The connection bumps 550 may include at least one of a solder ball, a bump, or a pillar. The connection bumps 550 may include a metal material. A third underfill layer 331 may be provided in a gap between the redistribution substrate 100 and the connection substrate 500 to surround or seal the connection bumps 550. The third underfill layer 331 may include an insulating polymer.

The molding layer 300 may be provided on the first semiconductor chip 210A, the second semiconductor chip 220A, and the connection substrate 500, as illustrated in FIG. 5A. The molding layer 300 may be disposed between the first and second semiconductor chips 210A and 220A, between the first semiconductor chip 210A and the connection substrate 500, and between the second semiconductor chip 220A and the connection substrate 500. In some example embodiments, an adhesive insulating film may be adhered onto the top surface of the connection substrate 500, the top surfaces of the first and second semiconductor chips 210A and 220A, and sidewalls of the first and second semiconductor chips 210A and 220A, thereby forming the molding layer 300. For example, an Ajinomoto build-up film (ABF) may be used as the adhesive insulating film. In certain embodiments, the molding layer 300 may include an insulating polymer such as an epoxy-based polymer. In certain embodiments, the first and second underfill layers 311 and 321 may be omitted, and the molding layer 300 may extend onto bottom surfaces of the first and second semiconductor chips 210A and 220A. When the third underfill layer 331 is omitted, the molding layer 300 may extend into the gap between the redistribution substrate 100 and the connection substrate 500.

The lower semiconductor package 21 may further include an upper redistribution layer 600. The upper redistribution layer 600 may be disposed on the molding layer 300 and the connection substrate 500. The upper redistribution layer 600 may include upper insulating patterns 610, upper redistribution patterns 620, and upper bonding pads 640. The upper insulating patterns 610, the upper redistribution patterns 620, and the upper bonding pads 640 may be substantially the same as described above with reference to FIG. 4. However, in some embodiments, at least one of the upper redistribution patterns 620 may extend into the molding layer 300 so as to be connected to the second pad 522.

The upper semiconductor package 22 may be disposed on the lower semiconductor package 21. For example, the upper semiconductor package 22 may be disposed on the upper redistribution layer 600. The upper semiconductor package 22 may include an upper substrate 710, an upper semiconductor chip 720, and an upper molding layer 730. The upper semiconductor package 22 and connection terminals 650 may be substantially the same as described with reference to FIG. 4. For example, the connection terminals 650 may be disposed between the lower semiconductor package 21 and the upper semiconductor package 22. The upper semiconductor package 22 may further include a heat dissipation structure 780.

According to the example embodiments of the inventive concepts, the dummy pattern may be provided between the under bump patterns. Thus, the top surfaces of the redistribution patterns may have reduced undulations or may not have an undulation. As a result, electrical connection between the redistribution patterns may be improved. Thus, the redistribution substrate and the semiconductor package including the same may have improved reliability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
    a redistribution substrate; and
    a semiconductor chip disposed on a top surface of the redistribution substrate,
    wherein the redistribution substrate comprises:
        under bump patterns laterally spaced apart from each other;
        a dummy pattern disposed between the under bump patterns;
        a passivation pattern disposed on a bottom surface of the dummy pattern;
        an insulating layer covering top surfaces and sidewalls of the under bump patterns, directly contacting a sidewall and a top surface of the dummy pattern, and directly contacting a sidewall of the passivation pattern; and
        a redistribution pattern disposed on one of the under bump patterns and electrically connected to the one under bump pattern,
    wherein the passivation pattern includes a different material from that of the insulating layer, and
    wherein bottom surfaces of the under bump patterns are disposed at a higher level than a bottom surface of the passivation pattern.

2. The semiconductor package of claim 1, wherein the redistribution pattern comprises:
    a via portion being in contact with the one under bump pattern; and
    an interconnection portion disposed on the via portion and the insulating layer.

3. The semiconductor package of claim 2, wherein an angle between the bottom surface and the sidewall of the dummy pattern is less than an angle between a bottom surface and a sidewall of the via portion.

4. The semiconductor package of claim 2, wherein a thickness of the one under bump pattern is greater than a thickness of the interconnection portion.

5. The semiconductor package of claim 4,
    wherein the thickness of the one under bump pattern ranges from 8 μm to 20 μm, and
    wherein the thickness of the interconnection portion ranges from 3 μm to 5 μm.

6. The semiconductor package of claim 1, wherein the redistribution pattern comprises:
    a conductive layer disposed on the insulating layer; and
    a seed pattern disposed between the one under bump pattern and the conductive layer.

7. The semiconductor package of claim 6, wherein the seed pattern is in contact with the top surface of the one under bump pattern.

8. The semiconductor package of claim 1,
wherein the under bump patterns include a first under bump pattern adjacent to the dummy pattern, and
wherein a distance between the dummy pattern and the first under bump pattern ranges from 5 µm to 10 µm.

9. The semiconductor package of claim 1,
wherein the insulating layer exposes a bottom surface of the passivation pattern, and
wherein the insulating layer does not cover bottom surfaces of the under bump patterns.

10. The semiconductor package of claim 1, wherein the redistribution pattern and the under bump patterns are insulated from the dummy pattern.

11. A semiconductor package comprising:
a redistribution substrate; and
a semiconductor chip disposed on a top surface of the redistribution substrate, wherein the redistribution substrate comprises:
an under bump pattern;
a dummy pattern horizontally spaced apart from a sidewall of the under bump pattern;
a passivation pattern disposed on a bottom surface of the dummy pattern;
an insulating layer covering the sidewall and a top surface of the under bump pattern, directly contacting a sidewall and a top surface of the dummy pattern, and directly contacting a sidewall of the passivation pattern; and
a redistribution pattern disposed on a top surface of the under bump pattern and electrically connected to the under bump pattern,
wherein the redistribution pattern comprises:
an interconnection portion extending in a direction parallel to the top surface of the under bump pattern; and
a via portion disposed between the under bump pattern and the interconnection portion and being in contact with the top surface of the under bump pattern,
wherein an angle between a bottom surface and a sidewall of the dummy pattern is less than an angle between a bottom surface and a sidewall of the via portion.

12. The semiconductor package of claim 11, wherein an angle between a bottom surface and the sidewall of the under bump pattern is less than the angle between the bottom surface and the sidewall of the via portion.

13. The semiconductor package of claim 11,
wherein the angle between the bottom surface and the sidewall of the dummy pattern ranges from 80 degrees to 100 degrees, and
wherein the angle between the bottom surface and the sidewall of the via portion ranges from 120 degrees to 135 degrees.

14. The semiconductor package of claim 11, wherein a width of the via portion is less than a width of the under bump pattern.

15. The semiconductor package of claim 11,
wherein the passivation pattern is not provided on a bottom surface of the under bump pattern.

16. A semiconductor package comprising:
a redistribution substrate;
a semiconductor chip disposed on a top surface of the redistribution substrate;
a bonding terminal disposed between the redistribution substrate and the semiconductor chip; and
a conductive terminal disposed on a bottom surface of the redistribution substrate,
wherein the redistribution substrate comprises:
an under bump pattern;
a dummy pattern horizontally spaced apart from a sidewall of the under bump pattern;
a passivation pattern disposed on a bottom surface of the dummy pattern;
a dummy seed pattern disposed between the passivation pattern and the dummy pattern;
an insulating layer covering the sidewall and a top surface of the under bump pattern, a sidewall of the dummy seed pattern, and a sidewall and a top surface of the dummy pattern, and directly contacting sidewalls of the passivation pattern and the dummy seed pattern;
a first redistribution pattern spaced apart from the top surface of the dummy pattern and electrically connected to the under bump pattern;
a second redistribution pattern disposed on a top surface of the first redistribution pattern and connected to the first redistribution pattern; and
a bonding pad electrically connected to the second redistribution pattern and the bonding terminal,
wherein the first redistribution pattern comprises:
a first conductive layer; and
a first seed pattern disposed between the top surface of the under bump pattern and the first conductive layer and between a bottom surface of the first conductive layer and the insulating layer,
wherein the second redistribution pattern comprises:
a second conductive layer; and
a second seed pattern disposed between the first conductive layer and the second conductive layer,
wherein the conductive terminal is disposed on a bottom surface of the under bump pattern and is electrically connected to the under bump pattern, and
wherein the conductive terminal is insulated from the dummy pattern.

17. The semiconductor package of claim 16, wherein the first redistribution pattern comprises:
a first interconnection portion having a long axis parallel to one direction; and
a first via portion disposed between the under bump pattern and the first interconnection portion and being in contact with the top surface of the under bump pattern.

18. The semiconductor package of claim 17,
wherein an angle between the bottom surface and the sidewall of the dummy pattern is less than an angle between a bottom surface and a sidewall of the first via portion, and
wherein an angle between the bottom surface and the sidewall of the under bump pattern is less than the angle between the bottom surface and the sidewall of the first via portion.

19. The semiconductor package of claim 16,
wherein the passivation pattern includes a different material from that of the insulating layer,
wherein the bottom surface of the under bump pattern is disposed at a higher level than a bottom surface of the insulating layer, and
wherein a bottom surface of the passivation pattern is coplanar with the bottom surface of the insulating layer.

* * * * *